(12) United States Patent
Levesque et al.

(10) Patent No.: US 12,744,505 B2
(45) Date of Patent: Sep. 22, 2026

(54) MULTIPLEXING FOR FILTER-BANKS COMPLEXITY REDUCTION

(71) Applicant: Qorvo US, Inc., Greensboro, NC (US)

(72) Inventors: Chris Levesque, Fountain Valley, CA (US); Mudar AlJoumayly, Casselberry, FL (US)

(73) Assignee: Qorvo US, Inc., Greensboro, NC (US)

( * ) Notice: Subject to any disclaimer, the term of this patent is extended or adjusted under 35 U.S.C. 154(b) by 114 days.

(21) Appl. No.: 18/952,280

(22) Filed: Nov. 19, 2024

(65) Prior Publication Data

US 2025/0167752 A1 May 22, 2025

Related U.S. Application Data

(60) Provisional application No. 63/573,163, filed on Apr. 2, 2024, provisional application No. 63/600,795, filed on Nov. 20, 2023.

(51) Int. Cl.
*H03H 7/46* (2006.01)
*H03H 7/01* (2006.01)

(52) U.S. Cl.
CPC ............ *H03H 7/46* (2013.01); *H03H 7/0138* (2013.01)

(58) Field of Classification Search
CPC ......... H03H 7/46; H03H 7/0138; H03H 7/465
See application file for complete search history.

(56) References Cited

U.S. PATENT DOCUMENTS 10,326,484 B1 * 6/2019 Ayranci ................ H04B 1/006
2018/0063031 A1 3/2018 Wloczysiak et al.
2022/0123732 A1 4/2022 Takeuchi
2023/0299745 A1 9/2023 Torpey et al.

* cited by examiner

*Primary Examiner* — Andrea Lindgren Baltzell
*Assistant Examiner* — Kimberly E Glenn
(74) *Attorney, Agent, or Firm* — Withrow & Terranova, P.L.L.C.

(57) ABSTRACT

The present disclosure relates to a filter architecture, which includes a filter bank with multiple filters, an input switch coupled to an input side of the filter bank, and an output switch coupled to an output side of the filter bank. Each filter is multiplexed with one or more different filters at the input side and the output side of the filter bank. At a given time, the input switch is controlled to connect a first group of the filters to a radio frequency (RF) input terminal, and the output switch is controlled to connect a second group of the filters to an RF output terminal. Herein, the first group and the second group have one filter in common, such that the input switch and the output switch are configured to select one of the filters to operate at the given time.

23 Claims, 15 Drawing Sheets

| FILTER | OUTPUT CONTROL BITS(3) FOR OUTPUT SWITCH 66 | | | INPUT CONTROL BITS(3) FOR INPUT SWITCH 64 | | | HEX VALUE |
|---|---|---|---|---|---|---|---|
| | M | | L | M | | L | |
| 68-1 | 0 | 0 | 0 | 1 | 1 | 1 | 7 |
| 68-2 | 0 | 0 | 1 | 1 | 1 | 0 | E |
| 68-3 | 0 | 0 | 0 | 1 | 0 | 1 | 5 |
| 68-4 | 0 | 0 | 1 | 1 | 1 | 1 | F |
| 68-5 | 0 | 0 | 0 | 1 | 1 | 0 | 6 |
| 68-6 | 0 | 0 | 1 | 1 | 0 | 1 | D |
| 68-7 | 0 | 1 | 0 | 1 | 1 | 1 | 17 |
| 68-8 | 0 | 1 | 1 | 1 | 1 | 0 | 1E |
| 68-9 | 0 | 1 | 0 | 1 | 0 | 0 | 14 |
| 68-10 | 0 | 1 | 1 | 1 | 0 | 1 | 1D |
| 68-11 | 0 | 1 | 0 | 0 | 1 | 1 | 13 |
| 68-12 | 0 | 1 | 1 | 1 | 0 | 0 | 1C |
| 68-13 | 1 | 0 | 0 | 0 | 1 | 1 | 23 |
| 68-14 | 1 | 0 | 1 | 1 | 0 | 0 | 2C |
| 68-15 | 1 | 0 | 0 | 0 | 1 | 1 | 22 |
| 68-16 | 1 | 0 | 1 | 0 | 1 | 1 | 2B |
| 68-17 | 1 | 0 | 0 | 0 | 0 | 1 | 21 |
| 68-18 | 1 | 0 | 1 | 0 | 0 | 0 | 28 |
| 68-19 | 1 | 1 | 0 | 0 | 1 | 0 | 32 |
| 68-20 | 1 | 1 | 1 | 0 | 0 | 1 | 39 |
| 68-21 | 1 | 1 | 0 | 0 | 0 | 0 | 30 |
| 68-22 | 1 | 1 | 1 | 0 | 1 | 0 | 3A |
| 68-23 | 1 | 1 | 0 | 0 | 0 | 1 | 31 |
| 68-24 | 1 | 1 | 1 | 0 | 0 | 0 | 38 |

*FIG. 6*

MULTIPLEXING FOR FILTER-BANKS COMPLEXITY REDUCTION

RELATED APPLICATIONS

This application claims the benefit of provisional patent application Ser. No. 63/600,795, filed Nov. 20, 2023, and provisional patent application Ser. No. 63/573,163, filed Apr. 2, 2024, the disclosures of which are hereby incorporated herein by reference in their entireties.

FIELD OF THE DISCLOSURE

The present disclosure relates to a filter architecture, which utilizes multiplexing of inputs and outputs of a filter-bank in combination with careful allocation of switch throws to provide simpler and better performing solutions.

BACKGROUND

As digital and analog systems are getting more complex and flexible, the pressure on reconfigurable radio frequency (RF) solutions increases. Coupled with the need for more frequency selective RF frontends, reconfigurability of filters becomes more and more important. Although tunable filters are highly desirable for the reconfigurable RF frontends, conventional tunable components may not meet filtering requirements such as insertion loss, rejection demands, and Q factors. Filter banks have become an alternative of choice.

However, as the demand for narrower bandwidths and wider frequency coverage increases, the number of individual filters in one filter bank increases, and thus the complexity of how to select a specific filter in the filter bank increases. More complex input and output switching or routing solutions for the filter banks will result in larger areas, higher costs, poorer performances (higher insertion losses), and very challenging component placements and layouts.

Accordingly, there remains a need for improved filter architecture designs, which utilize the filter banks without increasing complexity of switching solutions, so as to reduce the insertion loss, required area or footprint, cost, and routing in the final products.

SUMMARY

The present disclosure relates to a filter architecture, which utilizes multiplexing of inputs and outputs of a filter-bank in combination with careful allocation of switch throws to provide simpler and better performing solutions. The disclosed filter architecture includes a filter bank with multiple filters, an input switch coupled between a radio frequency (RF) input terminal and an input side of the filter bank, and an output switch coupled between an output side of the filter bank and an RF output terminal. Each filter is multiplexed with one or more different ones of the filters at the input side of the filter bank and the output side of the filter bank. At a given time, the input switch is controlled to connect a first group of the filters to the RF input terminal, and the output switch is controlled to connect a second group of the filters to the RF output terminal. Herein, the first group of the filters and the second group of the filters have one filter in common, such that the input switch and the output switch are configured to select a specific one of the filters to operate at the given time. The input switch and the output switch are controlled independently.

In one embodiment of the filter architecture, on either the input side or the output side of the filter bank, two or more of the filters are able to be multiplexed with each other only if the two or more of the filters have no overlap in a frequency domain.

In one embodiment of the filter architecture, each filter is diplexed with a first filter at the input side of the filter bank and is diplexed with a second filter at the output side of the filter bank. The first filter is different from the second filter.

In one embodiment of the filter architecture, each filter is triplexed with two filters at the input side of the filter bank and is triplexed with two different filters at the output side of the filter bank.

In one embodiment of the filter architecture, each filter is diplexed or triplexed with one or two different filters at the input side of the filter bank and the output side of the filter bank.

In one embodiment of the filter architecture, the input switch is a single pole multiple throw (SPnT) switch and includes a number of input switch throws.

The output switch is an SPnT switch and includes a number of output switch throws.

In one embodiment of the filter architecture, when one of the input switch throws is coupled to a specific group of the filters, any one of the output switch throws is coupled to no more than one filter in the specific group.

In one embodiment of the filter architecture, a number of the filters is N, which is an integer number. A number of the input switch throws is smaller than N, and a number of the output switch throws is smaller than N.

In one embodiment of the filter architecture, a number of the input switch throws is the same as a number of the output switch throws.

In one embodiment of the filter architecture, the number of the input switch throws is M, and the number of the output switch throws is M, where M equals $\lceil N/2 \rceil$ or $\lceil N/3 \rceil$.

In one embodiment of the filter architecture, the input switch is controlled by input control bits that determine which one of the input switch throws is conducted to the RF input terminal, and the output switch is controlled by output control bits that determine which one of the output switch throws is conducted to the RF output terminal. The input control bits are independent of the output control bits.

In one embodiment of the filter architecture, a number of the input switch throws is different from a number of the output switch throws.

In one embodiment of the filter architecture, throw-to-throw isolation within the input switch is better than a required out of band (OOB) rejection of each filter, and throw-to-throw isolation within the output switch is better than a required OOB rejection of each filter.

In one embodiment of the filter architecture, at least one filter is one of bulk acoustic wave (BAW) filters, surface acoustic wave (SAW) filters, and temperature compensated surface acoustic wave (TC-SAW) filters.

In one embodiment of the filter architecture, the filter bank includes eight filters, the input switch is a single pole four throw (SP4T) switch and includes four input switch throws, and the output switch is an SP4T switch and includes four output switch throws. Herein, each of the eight filters is diplexed with a different filter at the input side of the filter bank and the output side of the filter bank.

In one embodiment of the filter architecture, the filter bank includes eight filters, the input switch is a single pole three throw (SP3T) switch and includes three input switch throws, and the output switch is an SP3T switch and includes three output switch throws. Herein, each of the eight filters is diplexed or triplexed with one or more different filters at the input side of the filter bank and the output side of the filter bank.

In one embodiment of the filter architecture, the filter bank includes twenty-four filters, the input switch is a single pole eight throw (SP8T) switch and includes eight input switch throws, and the output switch is an SP8T switch and includes eight output switch throws. Herein, each of the eight filters is triplexed with two different filters at the input side of the filter bank and the output side of the filter bank.

According to one embodiment, a combo filter architecture includes a combo input switch coupled to an RF input terminal, a combo output switch coupled to an RF output terminal, and a number of filter architectures. Herein, the filter architectures are parallel to each other and coupled between the combo input switch and the combo output switch. The combo input switch and the combo output switch are configured to select one of the filter architectures to operate at a given time. Each filter architecture includes a filter bank with a number of filters, an input switch coupled between the combo input switch and an input side of the filter bank, and an output switch coupled between an output side of the filter bank and the combo output switch. Each filter is multiplexed with one or more different filters at the input side of the filter bank and the output side of the filter bank. At the given time, the input switch is controlled to connect a first group of the filters to the combo input switch, and the output switch is controlled to connect a second group of the filters to the combo output switch. The first group of the filters and the second group of the filters have one filter in common, such that the input switch and the output switch are configured to select a specific one of the filters to connect to both the combo input switch and the combo output switch at the given time. The input switch and the output switch are controlled independently.

In one embodiment of the combo filter architecture, the combo input switch and the combo output switch are controlled by common control bits.

In one embodiment of the combo filter architecture, each of the filters is diplexed or triplexed with one or two different filters at the input side of the filter bank and the output side of the filter bank.

In one embodiment of the combo filter architecture, on either the input side or the output side, two or more filters are able to be multiplexed with each other only if the two or more filters have no overlap in a frequency domain.

According to one embodiment, a method of designing a filter architecture starts with determining a number of filters of a filter bank in the filter architecture. The next step is determining which multiplexing approach is to be applied to the filters of the filter bank. Once the multiplexing approach is determined, a number of switch throws of an input switch and a number of switch throws of an output switch are determined. Each filter of the filter bank is then routed to both the input switch and the output switch using the determined multiplexing approach. Herein, each filter of the filter bank is multiplexed with one or more different filters of the filter bank at an input side of the filter bank and at an output side of the filter bank. An allocation of the switch throws of the input switch and the output switch is also programmed, such that only one specific filter of the filter bank is operating at a given time.

According to one embodiment, a communication device includes a baseband processor, receive circuitry, and transmit circuitry. Herein, at least one of the baseband processer, the transmit circuitry, and the receive circuitry includes a filter architecture. The filter architecture includes a filter bank with multiple filters, an input switch coupled between a radio frequency (RF) input terminal and an input side of the filter bank, and an output switch coupled between an output side of the filter bank and an RF output terminal. Each filter is multiplexed with one or more different ones of the filters at the input side of the filter bank and the output side of the filter bank. At a given time, the input switch is controlled to connect a first group of the filters to the RF input terminal, and the output switch is controlled to connect a second group of the filters to the RF output terminal. Herein, the first group of the filters and the second group of the filters have one filter in common, such that the input switch and the output switch are configured to select a specific one of the filters to operate at the given time. The input switch and the output switch are controlled independently.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 6 illustrates a mapping table used for controlling the filter architecture shown in FIG. 5.

Figure 1:
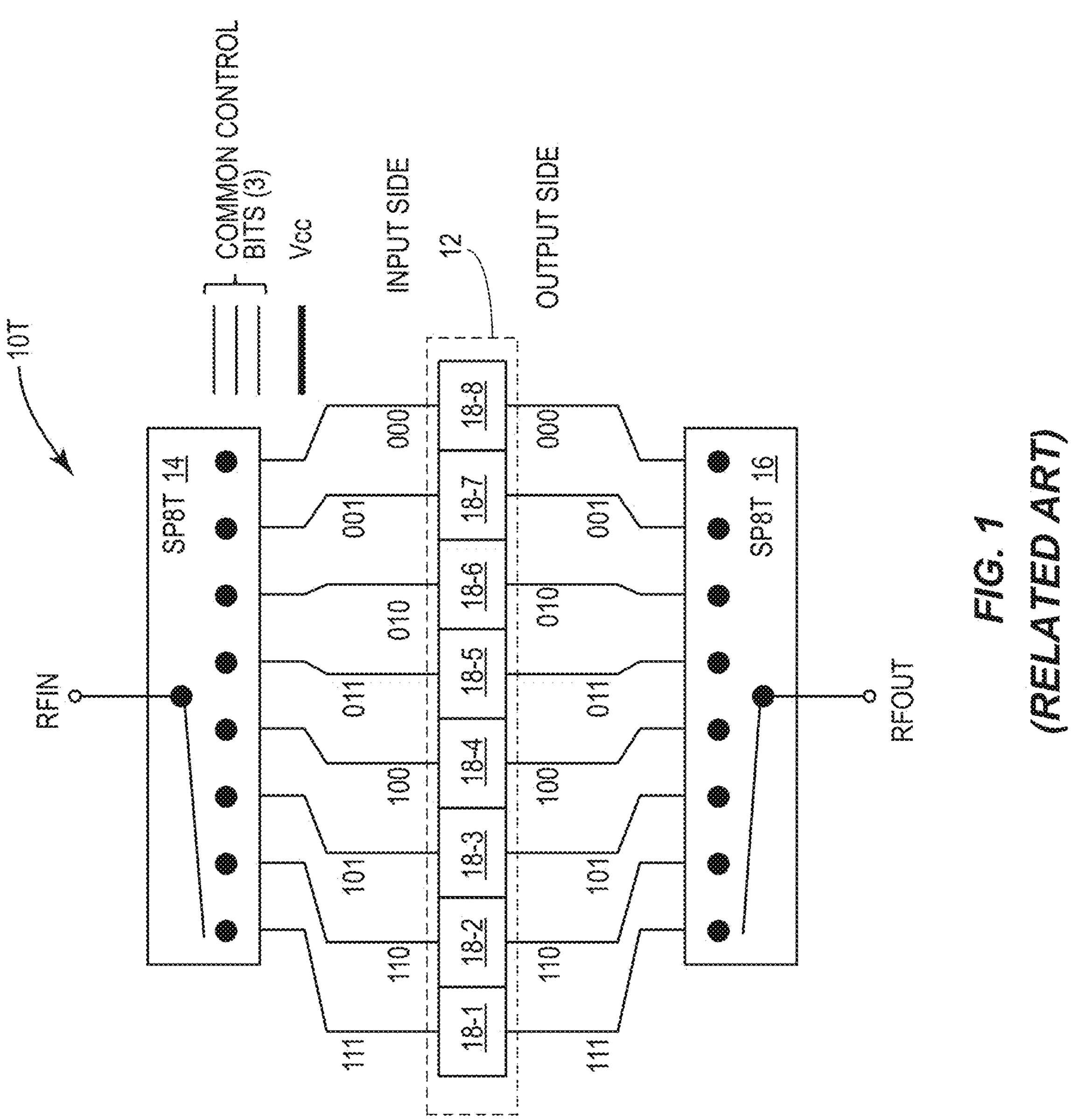
FIG. 1 illustrates a typical filter architecture including a filter bank and input/output switches.

It will be understood that for clear illustrations, FIGS. 1-11 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

To accommodate the need for more frequency selective radio frequency (RF) frontends, reconfigurability of filter architectures becomes highly desired. FIG. 1 illustrates a typical filter architecture 10T powered with a direct voltage Vcc, which includes a filter bank 12, an input switch 14, and an output switch 16. The input switch 14 and the output switch 16 are configured to select a specific filter 18 (e.g., for a specific bandwidth and/or a specific frequency coverage) in the filter bank 12 by control circuitry (not shown). In this illustration, the filter bank 12 includes eight filters (e.g., a first filter 18-1, a second filter 18-2, a third filter 18-3, a fourth filter 18-4, a fifth filter 18-5, a sixth filter 18-6, a seventh filter 18-7, and an eighth filter 18-8). Each of the input switch 14 and the output switch 16 may be a single pole multiple throw switch (SPnT) and controlled by control bits (e.g., from the control circuitry). When each of the eight filters 18 is connected to a dedicated switch throw of the input switch 14 and a dedicated switch throw of the output switch 16, each of the input switch 14 and the output switch 16 needs to have at least eight throws (e.g., single pole eight throw, SP8T, switch), and needs to be controlled by at least three control bits (e.g., from 000 to 111).

Herein, the three control bits are common for both the input switch 14 and the output switch 16, and each filter 18 uses symmetric throws in the input switch 14 and the output switch 16. For a non-limiting example, when the control bits are 111, the switch throw of the input switch 14 and the switch throw of the output switch 16 connected to the first filter 18-1 are conducted simultaneously, so that the first filter 18-1 is selected from the filter bank 12 to operate for a specific bandwidth and/or a specific frequency coverage. When the control bits are 010, the switch throw of the input switch 14 and the switch throw of the output switch 16 connected to the sixth filter 18-6 are conducted simultaneously, so that the sixth filter 18-6 is selected from the filter bank 12 to operate for another specific bandwidth and/or another specific frequency coverage. Similar control and operation strategies are applied to other filters 18 within the filter bank 12.

It is noted that the insertion loss and die size are proportional to the number of throws (first order) in the input switch 14 and the output switch 16, therefore, reducing the number of throws in the input switch 14 and the output switch 16 will be beneficial to filter architecture. By using careful multiplexing of inputs and outputs of a filter bank in combination with careful allocation of switch throws, the number of switch throws at both an input side and an output side can be reduced.

Figure 2A:
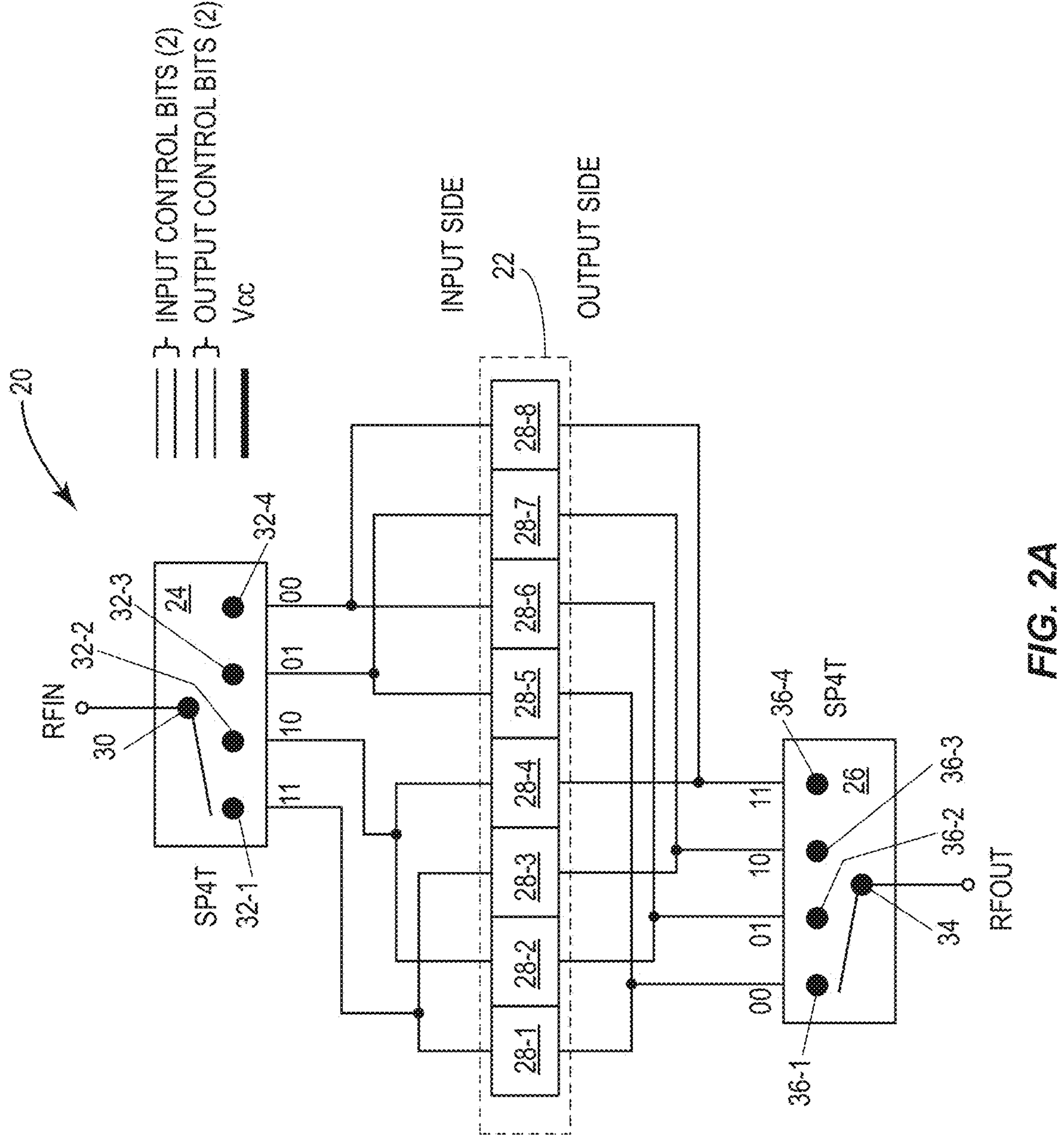
FIG. 2A illustrates an exemplary filter architecture according to some embodiments of the present disclosure.
Figure 2B:
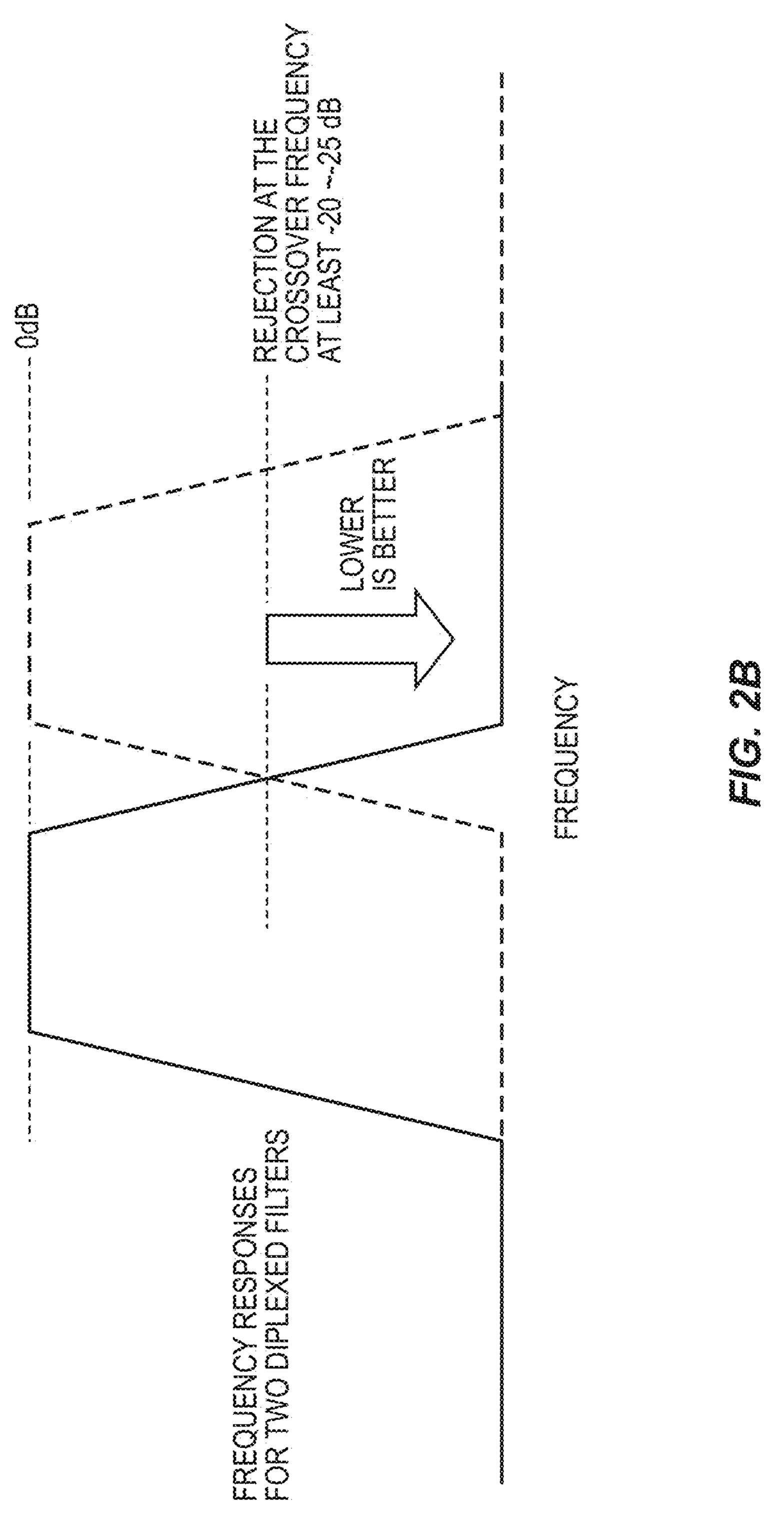
FIG. 2B illustrates a conceptual diagram of frequency responses of two diplexed filters within the filter architecture shown in FIG. 2A.

FIG. 2A illustrates an exemplary filter architecture 20 according to some embodiments of the present disclosure. The filter architecture 20 includes a filter bank 22, an input switch 24, and an output switch 26. In detail, the filter architecture 20 is powered with a direct voltage Vcc, and controlled by multiple control bits (e.g., two input control bits and two output control bits). The filter bank 22 includes eight filters 28 (e.g., a first filter 28-1, a second filter 28-2, a third filter 28-3, a fourth filter 28-4, a fifth filter 28-5, a sixth filter 28-6, a seventh filter 28-7, and an eighth filter 28-8), each of which may have a different bandwidth and/or a different frequency coverage. Certain filters 28 must have no overlap in a frequency domain. Herein and hereafter, no overlap between two filters in the frequency domain refers to at least −20 to −25 dB rejection in frequency response in a crossover frequency range of these two filters, as illustrated in FIG. 2B. The input switch 24 is coupled between an RF input terminal RFIN and the input side of the filter bank 22 and is controlled by the input control bits to selectively connect the RF input terminal RFIN to one or more filters 28 at the input side of the filter bank 22 at a given time. The output switch 24 is coupled between the output side of the filter bank 22 and an RF output terminal RFOUT and is controlled by the output control bits to selectively connect one or more of the filters 28 at the output side of the filter bank 22 to the RF output terminal RFOUT at the given time. The input control bits are independent of the output control bits.

For the purpose of this illustration, the input switch 24 is a single pole four throw (SP4T) switch, including an input pole 30 connected to the RF input terminal RFIN, a first input throw 32-1, a second input throw 32-2, a third input throw 32-3, and a fourth input throw 32-4. The output switch 26 is also an SP4T switch, including an output pole 34 connected to the RF output terminal RFOUT, a first output throw 36-1, a second output throw 36-2, a third output throw 36-3, and a fourth output throw 36-4. When one input throw 32 of the input switch 24 is coupled to a first pair of two filters 28, no output throw 36 of the output switch 26 is coupled to the same first pair of filters 28. In other words, each filter 28 is diplexed with a different filter on the input side and the output side. For instance, the first input throw 32-1 of the input switch 24 is coupled to the first and third filters 28-1 and 28-3 (i.e., the first filter 28-1 is diplexed with the third filter 28-3 on the input side), while the first output throw 36-1 of the output switch 26 is coupled to the first and fifth filters 28-1 and 28-5 (i.e., the first filter 28-1 is diplexed with the fifth filter 28-5 at the output side). The second input throw 32-2 of the input switch 24 is coupled to the second and fourth filters 28-2 and 28-4 (i.e., the second filter 28-2 is diplexed with the fourth filter 28-4 on the input side), while the second output throw 36-2 of the output switch 26 is coupled to the second and sixth filters 28-2 and 28-6 (i.e., the second filter 28-2 is diplexed with the sixth filter 28-6 on the output side). The third input throw 32-3 of the input switch 24 is coupled to the fifth and seventh filters 28-5 and 28-7 (i.e., the seventh filter 28-7 is diplexed with the fifth filter 28-5 on the input side), while the third output throw 36-3 of the output switch 26 is coupled to the third and seventh filters 28-3 and 28-7 (i.e., the seventh filter 28-7 is diplexed with the third filter 28-3 on the output side). The fourth input throw 32-4 of the input switch 24 is coupled to the sixth and eighth filters 28-6 and 28-8 (i.e., the eighth filter 28-8 is diplexed with the sixth filter 28-6 on the input side), while the fourth output throw 36-4 of the output switch 26 is coupled to the fourth and eighth filters 28-4 and 28-8 (i.e., the eighth filter 28-8 is diplexed with the fourth filter 28-4 on the output side). Two filters 28 that are diplexed with each other on the input side are never diplexed on the output side.

It is important that two filters 28 can be diplexed with each other on the input side or the output side only if such two filters 28 do not have overlap in the frequency domain. For a non-limited example, the first filter 28-1 and the third filter 28-3 (diplexed on the input side) do not have overlap in the frequency domain, and the first filter 28-1 and the fifth filter 28-5 (diplexed on the output side) do not have overlap in the frequency domain. For two filters 28 that are not diplexed on either the input side or the output side, the non-overlap restriction is not applied. For instance, the first filter 28-1 and the second filter 28-2 may or may not have overlap in the frequency domain. In addition, throw-to-throw isolation within the input switch 24/the output switch 26 (i.e., isolation between any two input switch throws within the input switch 24, or isolation between any two output switch throws within the output switch 26) has to be at least slightly better (e.g., 5 or 10 dB more rejection/suppression) than a required out of band (OOB) rejection of each filter 28, so that signal leakage from an inoperative filter 28 can be well isolated.

In addition, the input switch 24 and the output switch 26 are controlled independently. The two input control bits determine which input throw 32 in the input switch 24 is connected to the RF input terminal RFIN (via the input pole 30), and thereby determine inputs of which filters 28 are connected to the RF input terminal RFIN. The two output control bits determine which output throw 36 in the output switch 26 is connected to the RF output terminal RFOUT (via the output pole 34), and thereby determine outputs of which filters 28 are connected to the RF output terminal RFOUT. For a non-limiting example, when the third filter 28-3 is scheduled to operate, the input control bits are programmed to "11" to conduct the first input throw 32-1 of the input switch 24, and the output bits are programmed to "10" to conduct the third output throw 36-3 of the output switch 26. As such, inputs of the first filter 28-1 and the third filter 28-3 are electrically connected to the RF input terminal RFIN (via the first input throw 32-1 and the input pole 30), and outputs of the third filter 28-3 and the seventh filter 28-7 are electrically connected to the RF output terminal RFOUT (via the third output throw 36-3 and the output pole 34). The input of the third filter 28-3 is diplexed with the first filter 28-1, while the output of the third filter 28-3 is diplexed with the seventh filter 28-7. Since the input and output of the third filter 28-3 are connected to the RF input terminal RFIN and the RF output terminal RFOUT, respectively, the third filter 28-3 is able to operate. Since the input of the seventh filter 28-7 is connected to the non-conducted third input throw 32-3, the seventh filter 28-7 cannot operate. Similarly, since the output of the first filter 28-1 is connected to the non-conducted first output throw 36-1, the first filter 28-1 cannot operate. Note that there might be signal leakage from the first filter 28-1 into the first output throw 36-1 of the output switch 26. If a throw-throw isolation is better than a required OOB rejection of each filter 28, the signal leakage from the first filter 28-1 can be well isolated.

Figure 3:
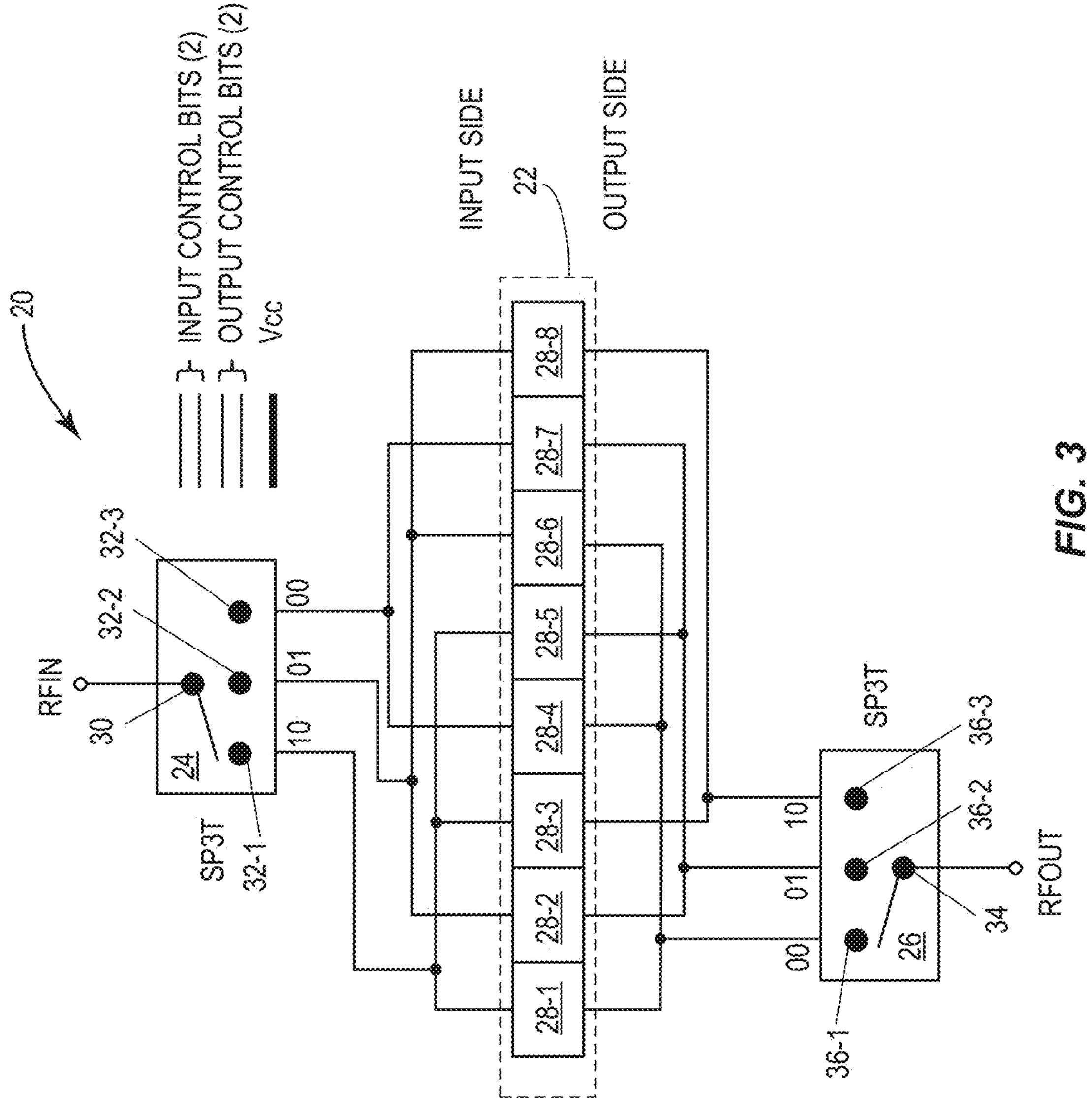
FIG. 3 illustrates an alternative implementation of the filter architecture according to some embodiments of the present disclosure.

In some embodiments, the filters 28 in the filter bank 22 may also be triplexed at both the input side and the output side of the filter architecture 20. As illustrated in FIG. 3, the filter architecture 20 is still powered with a direct voltage Vcc, the filter bank 22 still includes eight filters 28, and the input switch 24 and the output switch 26 are still controlled independently by the two input control bits and the two output control bits, respectively. However, the input switch 24 and the output switch 26 have fewer switch throws 32/36.

For the purpose of this illustration, the input switch 24 is a single pole three throw (SP3T) switch, including the input pole 30 connected to the RF input terminal RFIN, the first input throw 32-1, the second input throw 32-2, and the third input throw 32-3. The output switch 26 is also an SP3T switch, including the output pole 34 connected to the RF output terminal RFOUT, the first output throw 36-1, the second output throw 36-2, and the third output throw 36-3. One input throw 32 of the input switch 24 is coupled to a first group of two or three filters 28, then no output throw 36 of the output switch 26 is coupled to more than one filter 28 of the same first group. In other words, each filter 28 is diplexed or triplexed with different filter(s) on the input side and the output side. For instance, the first input throw 32-1 of the input switch 24 is coupled to the first, third, and fifth filters 28-1, 28-3, and 28-5 (i.e., the first filter 28-1, the third filter 28-3, and the fifth filter 28-5 are triplexed on the input side), while the first output throw 36-1 of the output switch 26 is coupled to the first, fourth, and sixth filters 28-1, 28-4, and 28-6 (i.e., the first filter 28-1, the fourth filter 28-4, and the sixth filter 28-6 are triplexed at the output side). The second input throw 32-2 of the input switch 24 is coupled to the second, sixth, and eighth filters 28-2, 28-6, and 28-8 (i.e., the second filter 28-2, the sixth filter 28-6, and the eighth filter 28-8 are triplexed on the input side), while the second output throw 36-2 of the output switch 26 is coupled to the second, fifth, and seventh filters 28-2, 28-5, and 28-7 (i.e., the second filter 28-2, the fifth filter 28-5, and the seventh filter 28-7 are triplexed on the output side). The third input throw 32-3 of the input switch 24 is coupled to the fourth and seventh filters 28-4 and 28-7 (i.e., the fourth filter 28-4 and the seventh filter 28-7 are diplexed on the input side), while the third output throw 36-3 of the output switch 26 is coupled to the third and eighth filters 28-3 and 28-8 (i.e., the third filter 28-3 and the eighth filter 28-8 are diplexed on the output side). The diplexed/triplexed filters 28 do not use the same switch throws 32/36 on the input side and the output side.

Herein, when the third filter 28-3 is scheduled to operate, the input control bits are programmed to "10" to conduct the first input throw 32-1 of the input switch 24, and the output bits are programmed to "10" to conduct the third output throw 36-3 of the output switch 26. As such, the inputs of the first filter 28-1, the third filter 28-3, and the fifth filter 28-5 are electrically connected to the RF input terminal RFIN (via the first input throw 32-1 and the input pole 30), and outputs of the third filter 28-3 and the eighth filter 28-8 are electrically connected to the RF output terminal RFOUT (via the third output throw 36-3 and the output pole 34). The input of the third filter 28-3 is triplexed with both the first filter 28-1 and the fifth filter 28-5, while the output of the third filter 28-3 is diplexed with the eighth filter 28-8. Since the input and the output of the third filter 28-3 are connected to the RF input terminal RFIN and the RF output terminal RFOUT, respectively, the third filter 28-3 is able to operate. Since the output of the first filter 28-1 is connected to the non-conducted first output throw 36-1, and the output of the fifth filter 28-5 is connected to the non-conducted second output throw 36-2, both the first filter 28-1 and the fifth filter 28-5 cannot operate. Similarly, since the input of the eighth filter 28-8 is connected to the non-conducted second input throw 32-2, the eighth filter 28-8 cannot operate.

As shown in FIGS. 2A and 3, using careful multiplexing and switch throw allocations, the number of switch throws 32/36 in the input switch 24/output switch 26 is reduced from eight to four (in the case of diplexing) or three (in the case of diplexing and triplexing) compared to the conventional architecture. FIGS. 2A and 3 only illustrate exemplary ways to diplex or triplex the filters 28 in the filter bank 22 and exemplary ways of how to allocate the switch throws 32/36. In different applications, the filter bank 22 may include fewer or more filters 28, and there are different ways to multiplex the filters 28 and to achieve switch throw allocations. By utilizing multiplexing and switch throw allocations, when the filter bank 22 includes N filters 28 (N is an integer number and typically larger than four), each of the input switch 24 and the output switch 26 may only include M switch throws 32/36, where $M=\lceil N/2\rceil$ (round-up N/2), $M=\lceil N/3\rceil$ up N/3), or M can be as small as $\lceil \log_2(N)\rceil$ (round-up $\log_2(N)$). The input control bits have $\lceil \log_2(M)\rceil$ (round-up $\log_2(M)$) bits, and the output control bits have $\lceil \log_2(M)\rceil$ (round-up $\log_2(M)$) bits. In different applications, different multiplexing approaches might be applied on the input side and the output side of the filter bank 22. For instance, the diplexing approach is applied to the input side (as shown in FIG. 2A) and both the duplexing approach and triplexing approach are applied to the output side (as shown in FIG. 3), and thereby, the input switch 24 and the output switch 26 may have different switch throws.

Figure 4A:
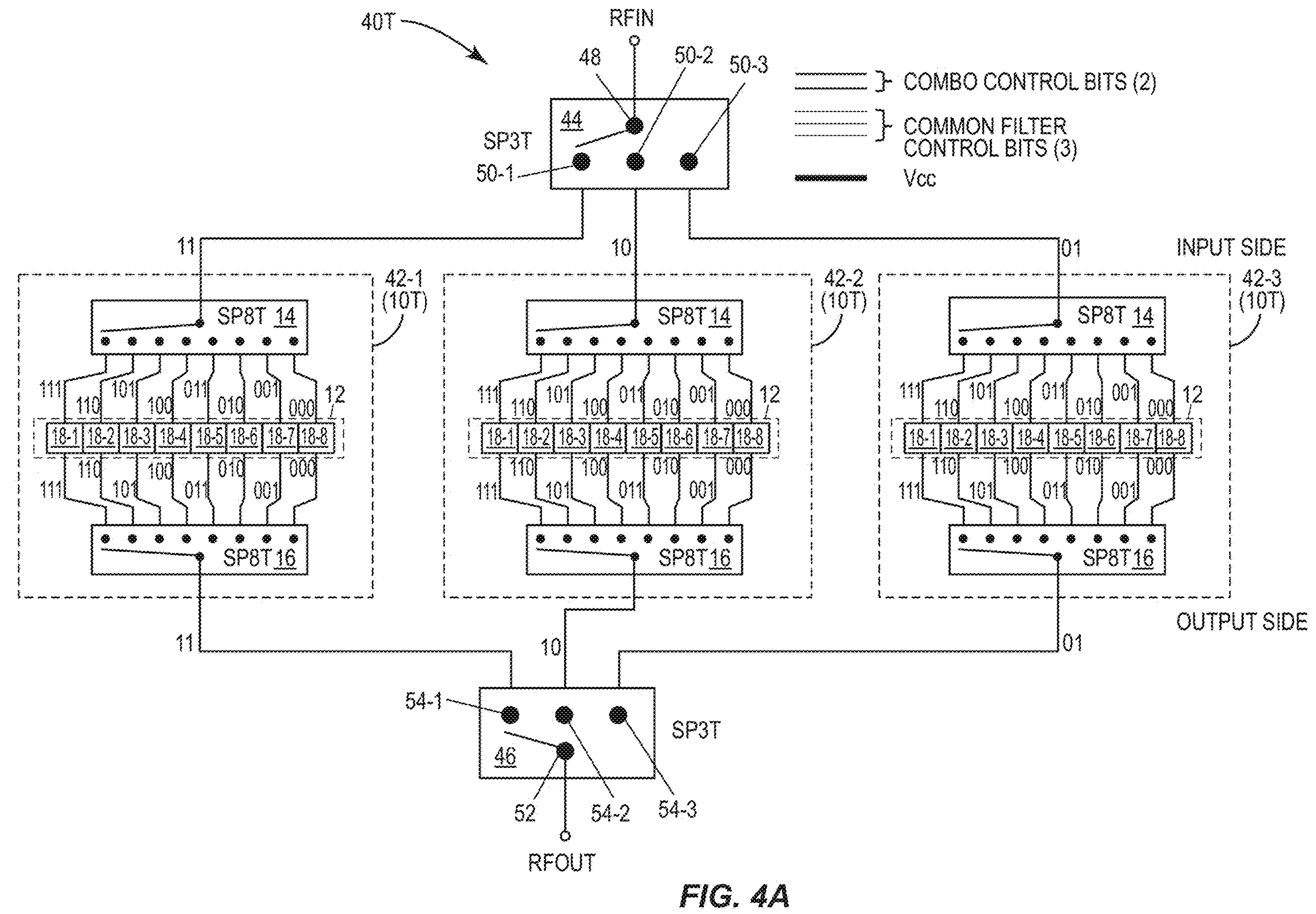
FIG. 4A illustrates a typical combo filter architecture with multiple filter banks.

In some cases, a large number of filters (e.g., a few dozen filters) might be desired in RF solutions. One implementation may combine several filter banks using a cascade structure. FIG. 4A illustrates a conventional combo filter architecture 40T powered with a direct voltage Vcc, which includes three filter architectures 42 (e.g., a first filter architecture 42-1, a second filter architecture 42-2, and a third filter architecture 42-3), a combo input switch 44, and a combo output switch 46. The three filter architectures 42 are parallel to each other and coupled between the combo input switch 44 and the combo output switch 46. The combo input switch 44 and the combo output switch 46 are configured to select a specific filter architecture 42 to operate, where selecting the specific filter architecture 42 is controlled by two combo control bits.

In one embodiment, the combo input switch 44 may be an SP3T switch, including an input pole 48 connected to the RF input terminal RFIN, a first input throw 50-1, a second input throw 50-2, and a third input throw 50-3. The output switch 26 may also be an SP3T switch, including an output pole 52 connected to the RF output terminal RFOUT, a first output throw 54-1, a second output throw 54-2, and a third output throw 54-3. The combo control bits may be common for both the combo input switch 44 and the combo output switch 46, and each filter architecture 42 uses symmetric throws in the combo input switch 44 and the combo output switch 46 (e.g., the first filter architecture 42-1 is connected to the first input throw 50-1 and the first output throw 54-1, the second filter architecture 42-2 is connected to the second input throw 50-2 and the second output throw 54-2, and the third filter architecture 42-3 is connected to the third input throw 50-3 and the third output throw 54-3). For a non-limited example, when the combo control bits are 11, the first input throw 50-1 and the first output throw 54-1 connected to the first filter architecture 42-1 are conducted simultaneously, so that the first filter architecture 42-1 is selected to operate.

When the combo control bits are 10, the second input throw 50-2 and the second output throw 54-2 connected to the second filter architecture 42-2 are conducted simultaneously, so that the second filter architecture 42-2 is selected to operate. When the combo control bits are 01, the third input throw 50-3 and the third output throw 54-3 connected to the third filter architecture 42-3 are conducted simultaneously, so that the third filter architecture 42-3 is selected to operate.

For the purpose of this illustration, each filter architecture 42 has a same configuration as the typical filter architecture 10T shown in FIG. 1. Herein, each filter architecture 42 has the filter bank 12 with eight filters 18, the SP8T input switch 14 and the SP8T output switch 16. Within each filter architecture 42, each of the eight filters 18 is connected to one dedicated switch throw of the input switch 14 and a dedicated switch throw of the output switch 16. The input switch 14 and the output switch 16 are controlled by common control bits (i.e., each filter 18 uses symmetric throws in the input switch 14 and the output switch 16). A combination of the combo control bits (e.g., 2 bits) and common filter control bits (e.g., 3 bits) determines which specific filter 18 of which specific filter architecture 42 is selected for operation.

Figure 4B:
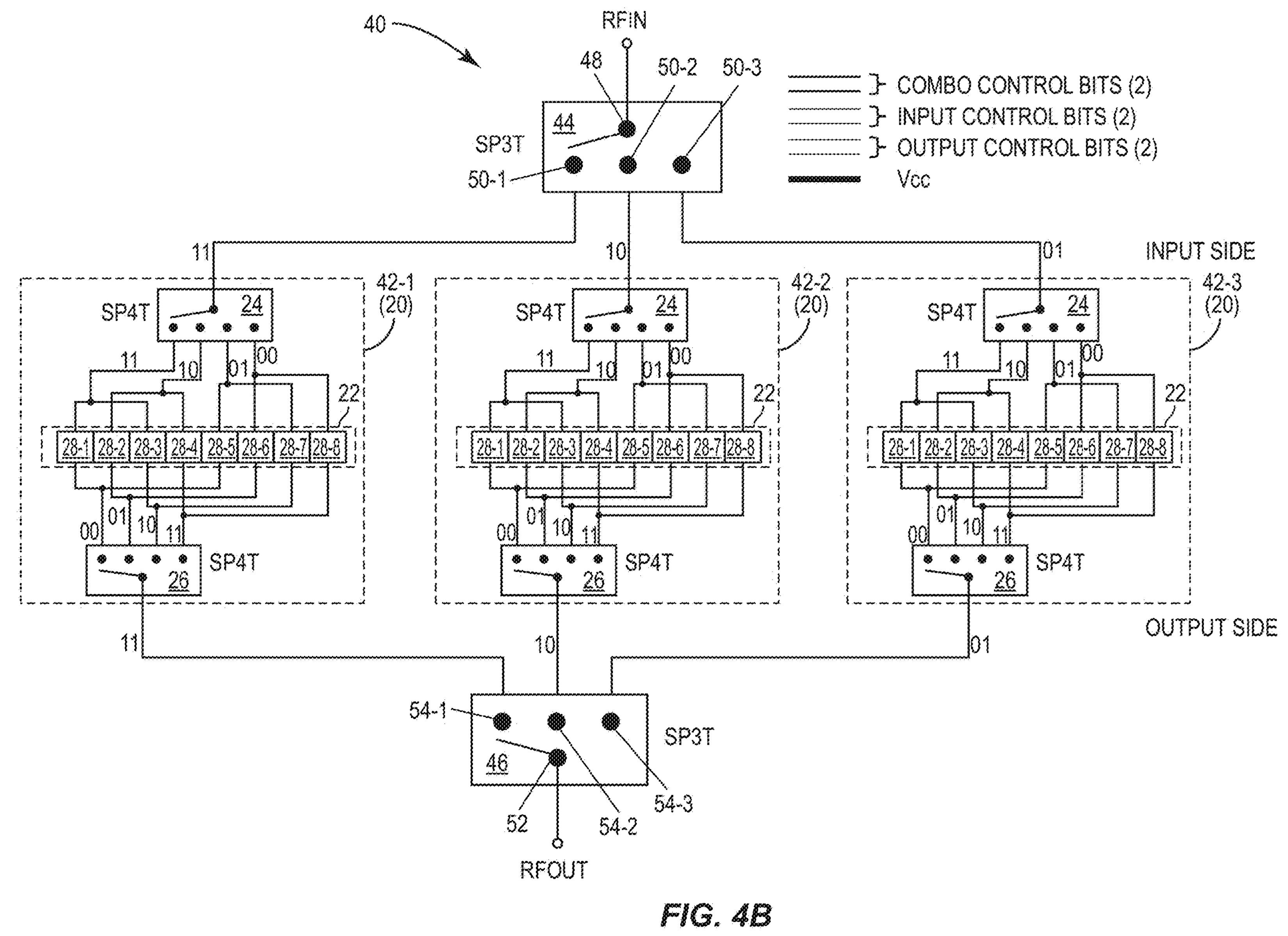
FIG. 4B illustrates an exemplary combo filter architecture according to some embodiments of the present disclosure.

As described above, the insertion loss and die size are proportional to the number of throws (first order) in the input switch 14 and the output switch 16. Therefore, reducing the number of throws in each filter architecture 42 will be beneficial both in terms of insertion loss and size. FIG. 4B illustrates an exemplary combo filter architecture 40 including three filter architectures 42 with the same cascade structure, but with each filter architecture 42 having a reduced number of switch throws. For the purpose of this illustration, each filter architecture 42 has the same configuration as the filter architecture 20 shown in FIG. 2A. Herein, each filter architecture 42 has the filter bank 22 with eight filters 28, the SP4T input switch 24 and the SP4T output switch 26. Within each filter architecture 42, by using careful multiplexing of inputs and outputs of the filter bank 22, the input switch 24 and the output switch 26 with reduced switch throws are still capable of selecting one specific filter 28 at a given time. The input switch 24 is controlled by the input control bits, while the output switch 26 is controlled by the output control bits, which are independent of the input control bits. A combination of the combo control bits (e.g., 2 bits), the input control bits (e.g., 2 bits), and the output control bits (e.g., 2 bits) determines which specific filter 28 of which specific filter architecture 42 is selected for operation. At the given time, the combo input switch 44 and the combo output switch 46 are configured to (controlled by the combo control bits) select one of the filter architectures 42 to operate. Within the selected filter architecture 42, the input switch 24 is controlled to connect a first group of the filters 28 to the combo input switch 44, and the output switch 26 is controlled to connect a second group of the filters 28 to the combo output switch 46. The first group of the filters 28 and the second group of the filters 28 have only one filter in common, such that the input switch 24 and the output switch 26 are configured to select a specific one of the filters 28 to connect to both the combo input switch 44 and the combo output switch 46 at the given time, as so to connected to both the RF input terminal RFIN and the RF output terminal RFOUT at the given time.

In different applications, the combo filter architecture 40 may include fewer or more filter architectures 42, and the combo input switch 44 and the combo output switch 46 may include fewer or more switch throws accordingly and are controlled by fewer or more combo control bits. In addition, each filter architecture 42 may have a different configuration with different multiplexing of inputs and outputs of the filter bank 22 (e.g., a same configuration as the filter architecture 20 shown in FIG. 3). Furthermore, each filter architecture 42 may include fewer or more filters and is controlled by fewer or more input/output control bits accordingly.

It is noted that, although the combo filter architecture 40 improves insertion loss and die size due to the multiplexing structure within each filter architecture 42, the cascade configuration of the combo filter architecture 40 may also increase the insertion loss. In addition, since each switch (e.g., the combo input/output switch 44/46, switches inside the filter architectures 42) may have its own charge-pump and digital blocks, the cascade configuration is not a very good use of die area. On the other hand, without the cascade configuration, if the single die 24-throw switches are utilized on the input and output sides to select a specific filter out of 24 filters (similar to what is shown in FIG. 1), more control bits are required without benefit in the insertion loss, die size, or performance yield.

Figure 5:
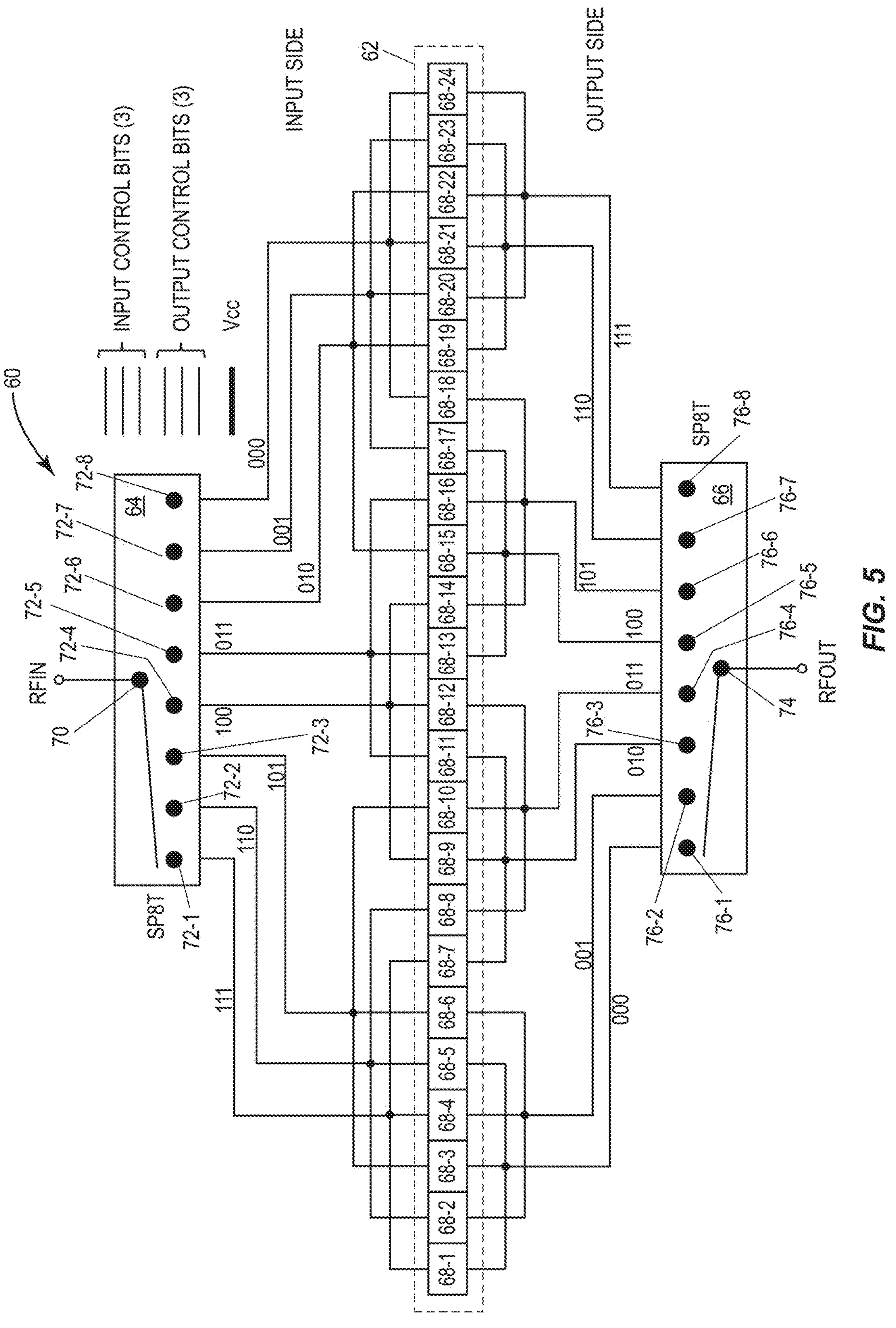
FIG. 5 illustrates an exemplary filter architecture including a filter bank with a large number of filters according to some embodiments of the present disclosure.

FIG. 5 illustrates an exemplary filter architecture 60 using multiplexing configurations to accommodate a large number of filters (e.g., twenty-four filters) combined with limited-throw switches (e.g., SP8T switches). The filter architecture 60 is powered with a direct voltage Vcc and includes a filter bank 62, an input switch 64, and an output switch 66. For the purpose of this illustration, the filter bank 62 includes twenty-four filters 68 (e.g., first to twenty-fourth filters 68-1~68-24), each of which may have a different bandwidth and/or a different frequency coverage. Certain filters 68 must have no overlap in the frequency domain. The input switch 64 is coupled between the RF input terminal RFIN and an input side of the filter bank 62 and is configured to selectively connect the RF input terminal RFIN to one or more filters 68 within the filter bank 62 at a given time. The output switch 64 is coupled between an output side of the filter bank 62 and the RF output terminal RFOUT and is configured to selectively connect one or more filters 68 within the filter bank 62 to the RF output terminal RFOUT at the given time.

In some embodiments, the input switch 64 may be an SP8T switch, including an input pole 70 connected to the RF input terminal RFIN and eight input throws 72 (e.g., first to eighth input throws 72-1~72-8). The output switch 66 is also an SP8T switch, including an output pole 74 connected to the RF output terminal RFOUT and eight output throws 76 (e.g., first to eighth output throws 76-1~76-8). When one input throw 72 of the input switch 64 is coupled to a first group of three filters 68, then no output throw 76 of the output switch 66 is coupled to more than one filter 68 of the same first group. In other words, each filter 28 is triplexed with different filters on the input side and the output side. For instance, the first input throw 72-1 of the input switch 64 is coupled to the first, fourth, and seventh filters 28-1, 28-4, and 28-7 (i.e., the first filter 68-1, the fourth filter 68-4, and the seventh filter 68-7 are triplexed on the input side), while the first output throw 76-1 of the output switch 66 is coupled to the first, third, and fifth filters 68-1, 68-3, and 68-5 (i.e., the first filter 68-1, the third filter 68-3, and the fifth filter 68-5 are triplexed at the output side). The eighth input throw 72-8 of the input switch 64 is coupled to the eighteenth, twenty-first, and twenty-fourth filters 68-18, 68-21, and 68-24 (i.e., the eighteenth filter 68-18, the twenty-first filter 68-21, and the twenty-fourth filter 68-24 are triplexed on the input side), while the eighth output throw 76-8 of the output switch 66 is coupled to the twentieth, twenty-second, and twenty-fourth filters 68-20, 68-22, and 68-24 (i.e., the twentieth filter 68-20, the twenty-second filter 68-22, and the twenty-fourth filter 68-24 are triplexed at the output side). The triplexed filters 68 do not use the same switch throws 72/76 on the input side and the output side.

It is important that three filters 68 can be triplexed with each other on the input side or the output side only if such three filters 68 do not overlap in the frequency domain. For a non-limiting example, the first filter 68-1, the fourth filter 68-4, and the seventh filter 68-7 (triplexed on the input side) do not have overlap in the frequency domain, and the first filter 68-1, the third filter 68-3, and the fifth filter 68-5 (triplexed on the output side) do not have overlap in the frequency domain. In addition, throw-to-throw isolation within the input switch 64/the output switch 66 has to be at least slightly better than a required OOB rejection of each filter 68, so that an OOB impedance of each filter 68 will not load onto the passbands of the other filters 68.

Herein, the input switch 64 and the output switch 66 are controlled by input control bits and output control bits, respectively. In this case, the input switch 64 is controlled by three input control bits that determine which input throw 72 in the input switch 64 is connected to the RF input terminal RFIN (via the input pole 70), and thereby determine inputs of which filters 68 are connected to the RF input terminal RFIN. The output switch 66 is controlled by three output control bits that determine which output throw 76 in the output switch 66 is connected to the RF output terminal RFOUT (via the output pole 74), and thereby determine outputs of which filters 68 are connected to the RF output terminal RFOUT. For a non-limiting example, when the third filter 68-3 is scheduled to operate, the input control bits are programmed to "101" to conduct the third input throw 72-3 of the input switch 64, and the output bits are programmed to "000" to conduct the first output throw 76-1 of the output switch 66. As such, inputs of the third filter 68-3, the sixth filter 68-6, and the tenth filter 68-10 are electrically connected to the RF input terminal RFIN (via the third input throw 72-3 and the input pole 70), and outputs of the first filter 68-1, the third filter 68-3, and the fifth filter 68-5 are electrically connected to the RF output terminal RFOUT (via the first output throw 76-1 and the output pole 74). The input of the third filter 68-3 is triplexed with the sixth filter 68-6 and the tenth filter 68-10, while the output of the third filter 68-3 is triplexed with the first filter 68-1 and the fifth filter 68-5. Since the input and output of the third filter 68-3 are connected to the RF input terminal RFIN and the RF output terminal RFOUT, respectively, the third filter 68-3 is able to operate. Since the outputs of the sixth filter 68-6 and the tenth filter 68-10 are connected to the non-conducted output throws 76, the sixth filter 68-6 and the tenth filter 68-10 cannot operate. Similarly, since the inputs of the first filter 68-1 and the fifth filter 68-5 are connected to the non-conducted input throws 72, the first filter 68-1 and the fifth filter 68-5 cannot operate. FIG. 6 illustrates a mapping table between specific numerical combinations of the input and output control bits and a corresponding operating filter 68. It is noted that the numerical combinations for the filters 68 do not follow ascending binary or HEX numbering.

In different applications, the filter bank 62 may include fewer or more filters 68, and the input switch 64 and the output switch 66 may include fewer or more switch throws accordingly and are controlled by fewer or more control bits. In addition, FIG. 5 only illustrates exemplary ways to triplex the filters 68 in the filter bank 62 and exemplary ways of how to allocate the switch throws 72/76. In different applications, there are different ways to multiplex the filters 68 (e.g., including both triplexing and diplexing) and to achieve switch throw allocations. For instance, in the cases where the number of filters 68 is less than twenty-four, but greater than sixteen, some filters 68 will be diplexed instead of triplexed. When the number of filters 68 is greater than eight and less than seventeen, the diplexing approach will still allow SP8T switches to be used. Although diplexing and triplexing approaches are described, multiplexing (e.g., quadruplexing, or higher-order multiplexing) the filters 68 together is possible.

By using careful multiplexing of inputs and outputs of the filters 68 in combination with careful allocation of switch throws 72/76 in the input and output switches 64 and 66, the number of switch throws at both the input and output side can be reduced. The multiplexing solution described above is able to reduce the number of switch throws to an absolute minimum while supporting flexibility expected from a filterbank. Reducing the switch complexity results in reduced insertion loss, reduced die area, reduced cost and simpler routing in the final product. On the other hand, in order to diplex or triplex filters together, there must be at least a −20 to −25 dB rejection at the crossover frequency to ensure that filtering edges within the filter bank will not be overloaded. It is necessary to ensure that each filter's OOB impedance and/or phase do not load onto other filter passbands. Certain filters in the filter bank can be optimized as a group to ensure that passbands do not load each other (e.g., one filter will have a high impedance for a passband of another filter). The optimization can be done without any external components. However, in the case when existing filters cannot be self-optimized, external components (like multiplex components) might be used to provide proper phasing. Although the diplexing or triplexing approach may cause extra insertion loss (e.g., about 0.1 to 0.2 dB insertion loss increase per additional multiplexing per side), the reduced switching complexity (due to the diplexing/triplexing approach) is expected to save over 1 dB per side.

Due to their small size, high Q values, and very low insertion losses at microwave frequencies, particularly those above 1.5 Gigahertz (GHz), bulk acoustic wave (BAW) filters have been widely used in many modern wireless applications. FIGS. 7A-7D illustrate different filter architectures 80 including a same number of BAW filters 82. For the purpose of these illustrations, each filter architecture 80 includes twenty-nine BAW filters 82 (only one BAW filter is labeled with a reference number in each of FIGS. 7A-7D). FIG. 7A illustrates a conventional first filter architecture 80-1, which requires two large switches 84-1 (single pole twenty-nine throw, SP29T, switches) to activate one single BAW filter 82 at a given time. These two SP29T switches 84-1 suffer from increased matching loss due to their large OFF capacitance.

Figure 7B:
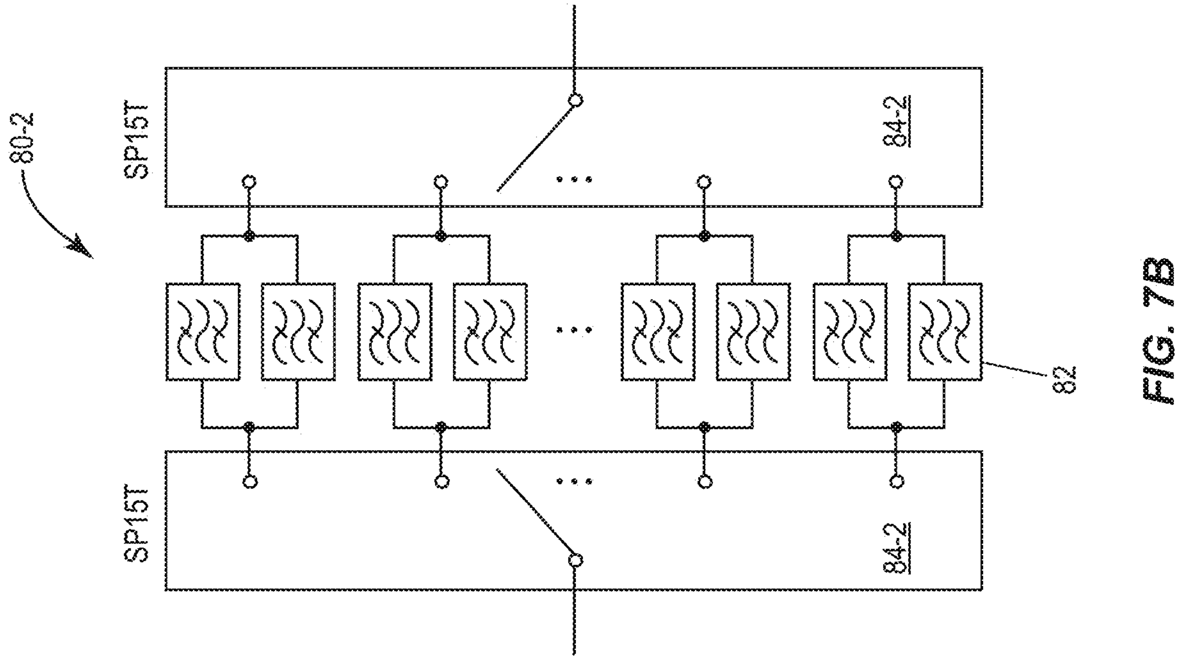
FIGS. 7A-7D illustrate different filter architectures with a number of bulk acoustic wave (BAW) filters.
Figure 7A:
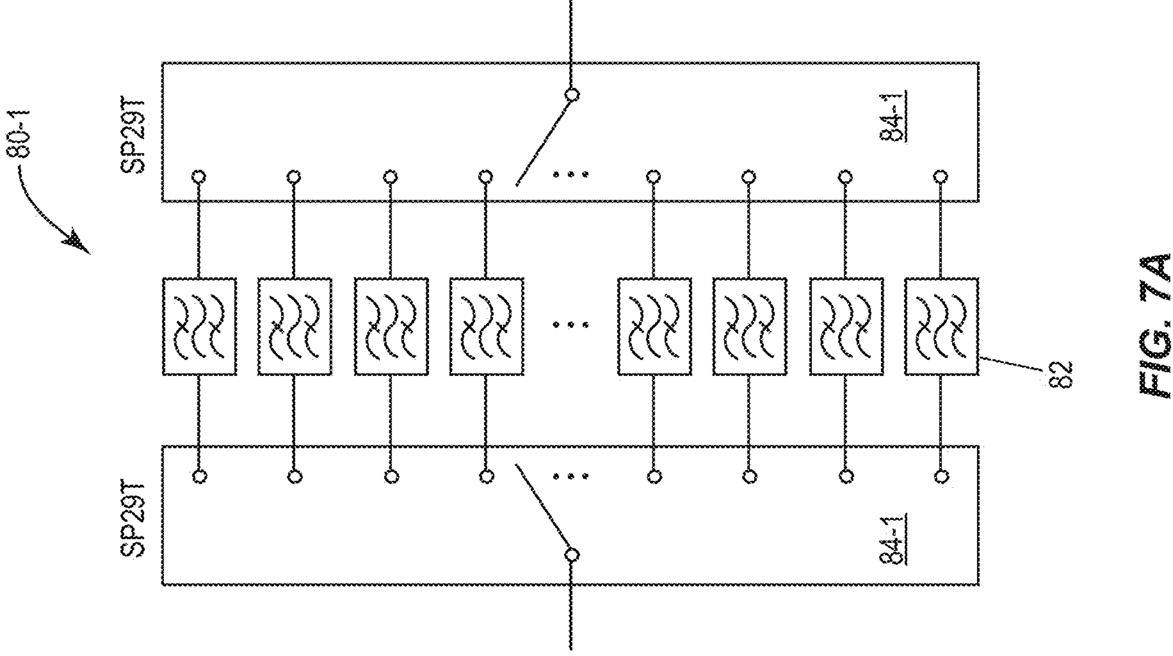

To reduce the matching loss, a second filter architecture 80-2, within which every two BAW filters 82 are diplexed symmetrically at their input and output sides, is illustrated in FIG. 7B. The number of switch throws in each switch 84-2 are reduced by ~50%, and the switches 84-2 are single pole fifteen throw (SP15T) switches. Hence, the OFF capacitance of the switches 84-2 can also be reduced by ~50%. This second filter architecture 80-2, however, activates two bands of two BAW filters 82 at a given time, which restricts the two BAW filters 82 to be diplexed to meet out-of-band rejection specifications.

Figure 7C:
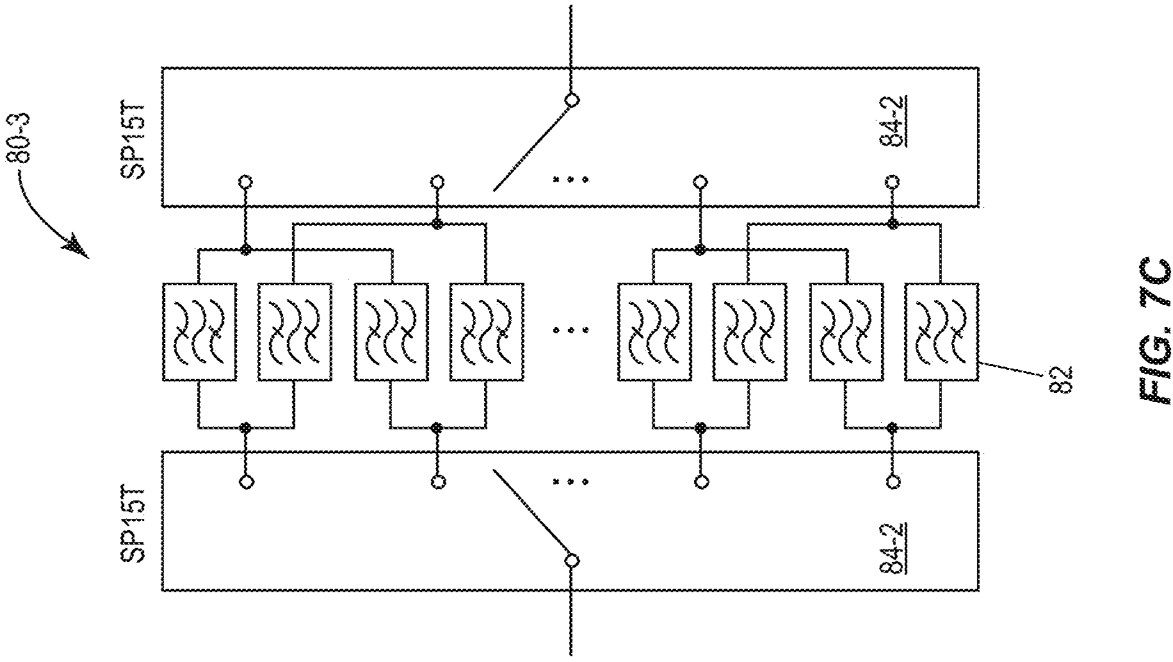

To overcome such out-of-band rejection restrictions and maintain the reduction in the switch size (i.e., reduced number of switch throws), a third filter architecture 80-3, within which an input and an output of each BAW filter 82 are diplexed with different other BAW filters 82, is illustrated in FIG. 7C (similar concepts as shown in FIG. 2A). The third filter architecture 80-3 activates a single band at a given time, while using an SP15T switch 84-2 per side (input and output sides). Further reduction in switch size and insertion loss may be achieved by multiplexing three BAW filters 82 instead of two.

Figure 7D:
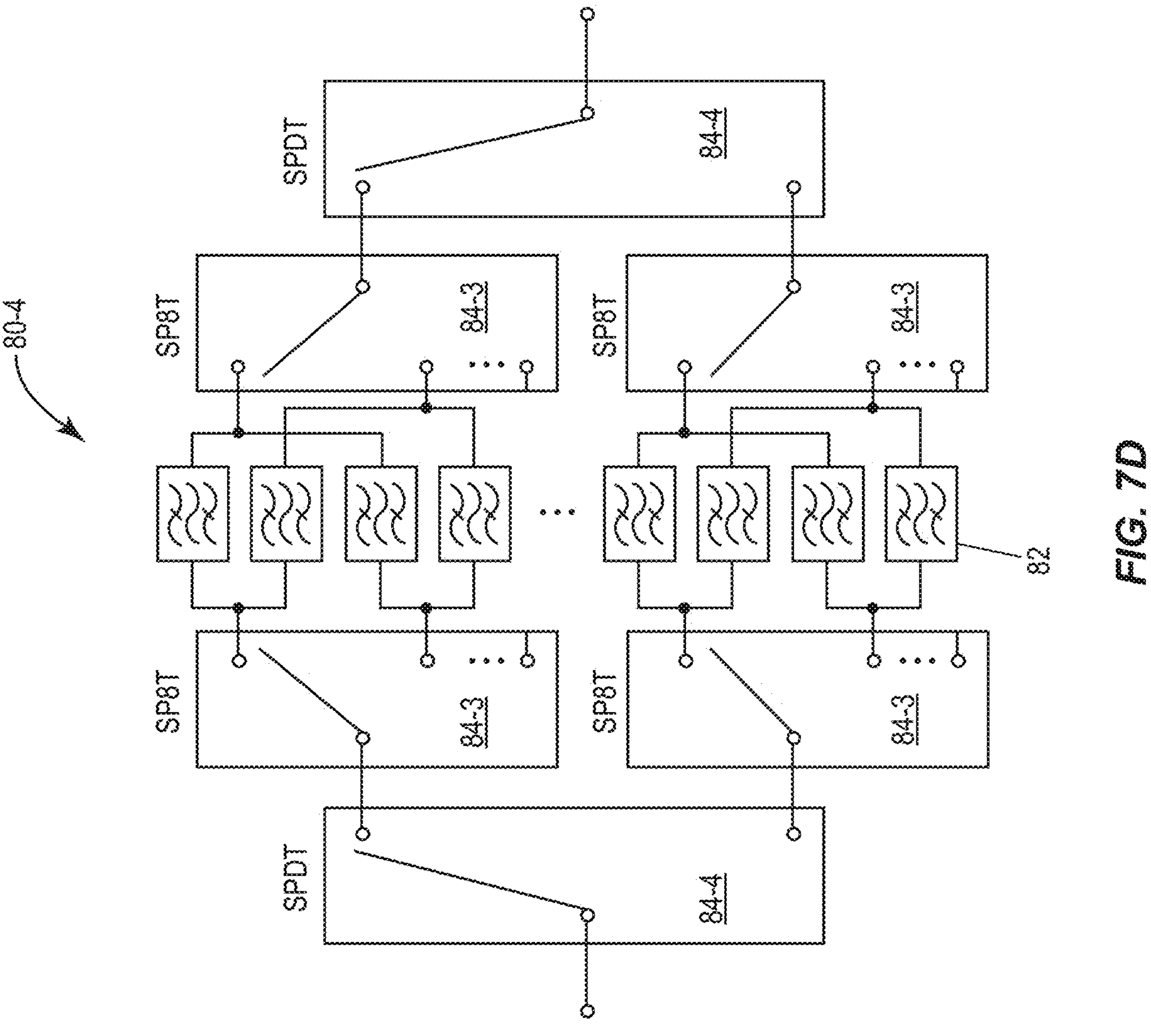

FIG. 7D illustrates a fourth filter architecture 80-4, which has a cascaded switch configuration per side (similar concepts as shown in FIG. 4B). The fourth filter architecture 80-4 includes two SP8T switches 84-3 cascaded with one single pole dual throw (SPDT) switch 84-4 at each input/output side. The fourth filter architecture 80-4 can also activate a single band at a given time, achieve further reduced OFF capacitance, and further improve matching loss despite the increased resistive loss. It is noted that FIGS. 7C-7D are just examples of using multiplexing approaches to the BAW filters, but not limited to. The multiplexing approaches may also be applied to surface acoustic wave (SAW) filters, temperature compensated surface acoustic wave (TC-SAW) filters, any combination of BAW, SAW and TC-SAW filters, and other types of filters.

Figure 8A:
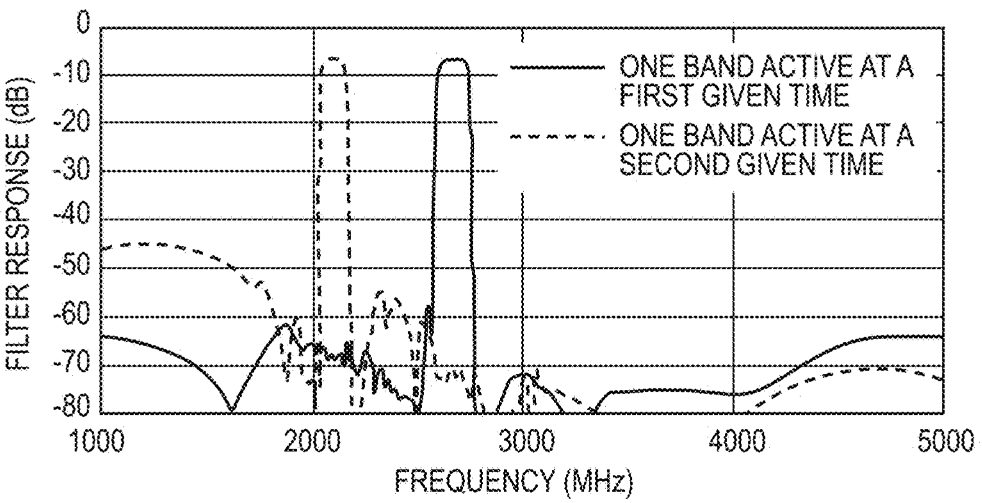
FIGS. 8A-8C illustrate filter response versus frequency for different filter architectures.
Figure 8B:
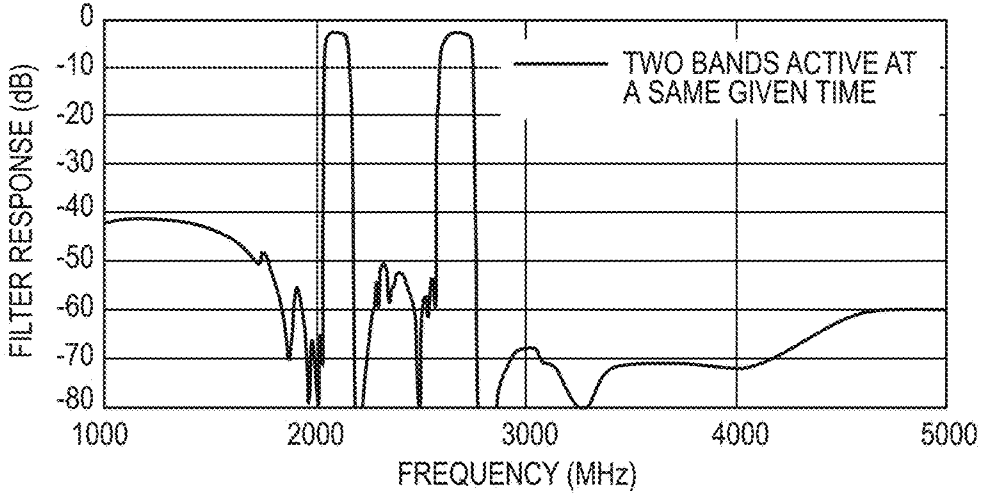
Figure 8C:
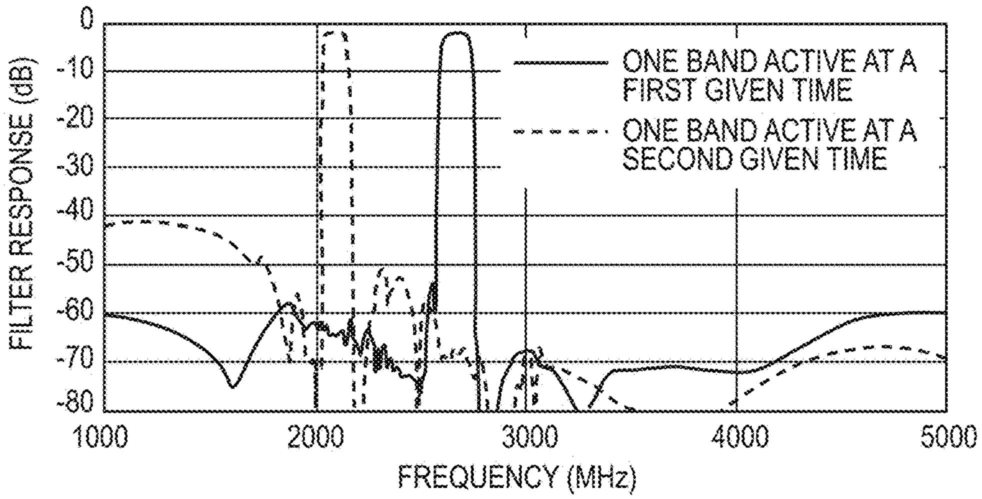

FIGS. 8A-8C illustrate filter response versus frequency for the filter architectures 80 shown in FIGS. 7A-7D. FIG. 8A illustrates filter responses for the first filter architecture 80-1, where one band is active at a given time, and increased loss (e.g., about −7 dB) is observed due to a matching loss caused by the SP29T switches 84-1. FIG. 8B illustrates a filter response for the second filter architecture 80-2, where two bands are active at a given time, and the matching loss is improved (e.g., about −2.5 dB) by using the smaller SP15T switches 84-2 instead of the SP29T switches 84-1. FIG. 8C illustrates a filter response for the third/fourth filter architecture 80-3/80-4, which combines the benefits of the first and second filter architectures 80-1 and 80-2: activating a single band at a given time while improving matching loss (e.g., about −2.5 dB).

Figure 9:
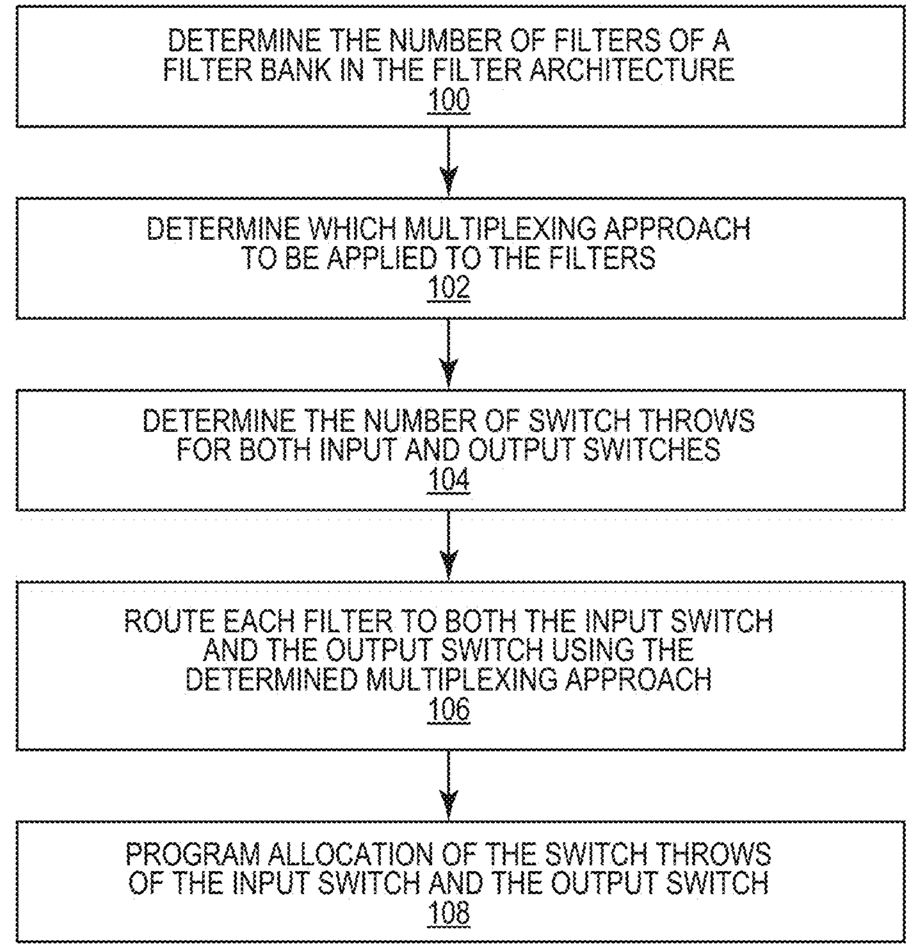
FIG. 9 illustrates a flowchart of a method of designing one filter architecture according to some embodiments of the present disclosure.

FIG. 9 illustrates a flowchart of a method of designing a filter architecture (e.g., the filter architectures 20/40/60/80-3/80-4) according to some embodiments of the present disclosure. Although the process steps are illustrated in a series, the process steps are not necessarily order dependent. Some steps may be done in a different order than that presented. Further, processes within the scope of this disclosure may include fewer or more steps than those illustrated in FIG. 9. Initially, determine the number of filters of a filter bank in the filter architecture based on requirements of bandwidths and frequency coverages (step 100). Next, determine which multiplexing approach (e.g., diplexing, triplexing, mixed diplexing and triplexing, or etc.) is to be applied to the filters (step 102). Based on the determined number of the filters and the determined multiplexing approach, determine an appropriate number of switch throws for both input and output switches, each of which is a SPnT switch (step 104). The input switch is coupled to an input side of the filter bank and an RF input terminal, and the output switch is coupled to the output side of the filter bank and an RF output terminal. Each filter is then routed to the input switch and the output switch using the determined multiplexing approach (step 106). Herein, one input switch throw of the input switch may be routed to a first group of filters in the filter bank, and one output switch throw of the output switch may be routed to a second group of filters in the filter bank, the first group and the second group having no more than one filter in common. In other words, each filter is multiplexed with different filters of the filter bank at the input side and the output side. On either the input side or the output side, two or more filters are able to be multiplexed with each other only if the two or more filters have no overlap in the frequency domain. Lastly, program an allocation of the switch throws of the input switch and the output switch (step 108). The input switch and the output switch are controlled by input control bits and output control bits, respectively. The input control bits determine which input switch throw of the input switch is conducted at a given time, and the output control bits determine which output switch throw of the output switch is conducted at the given time. As such, when the input switch is controlled to connect a first group of filters to the RF input terminal at a given time, and the output switch is controlled to connect a second group of filters to the RF output terminal at the given time, the first group and the second group have one filter in common, such that the input switch and the output switch are configured to select one specific filter to operate at the given time.

Figure 10:
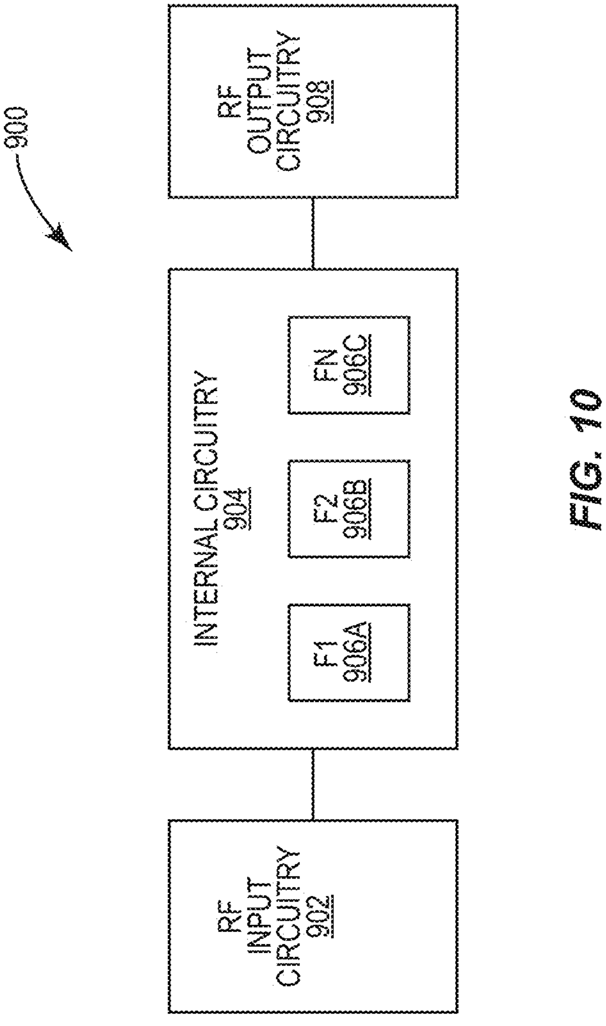
FIG. 10 illustrates a block diagram of an example system that includes at least one filter architecture.

FIG. 10 illustrates a block diagram of an example system 900 that includes at least one filter architecture using a multiplexing approach described above. The system 900 includes RF input circuitry 902 connected to internal circuitry 904 (e.g., filter circuitry or multiplexer circuitry). In certain embodiments, the RF input circuitry 902 includes a transceiver (not shown). For the purpose of this illustration, the filter circuitry 904 includes three filter architectures 906A, 906B, and 906C. Herein, one or more of the filter architectures 906A, 906B, and 906C may use the multiplexing approach described above. In different applications, the filter circuitry 904 may include fewer or more filter architectures. In one embodiment, each of the filter architectures 906A, 906B, and 906C may achieve bandpass filtering, and the filter architectures 906A, 906B, and 906C may be connected in a cascaded arrangement. The filter circuitry 904 is connected to an RF output circuitry 908. In certain embodiments, the RF output circuitry 908 includes an antenna (not shown). The RF input circuitry 902 and/or the RF output circuitry 908 may include additional or different components in other embodiments.

Figure 11:
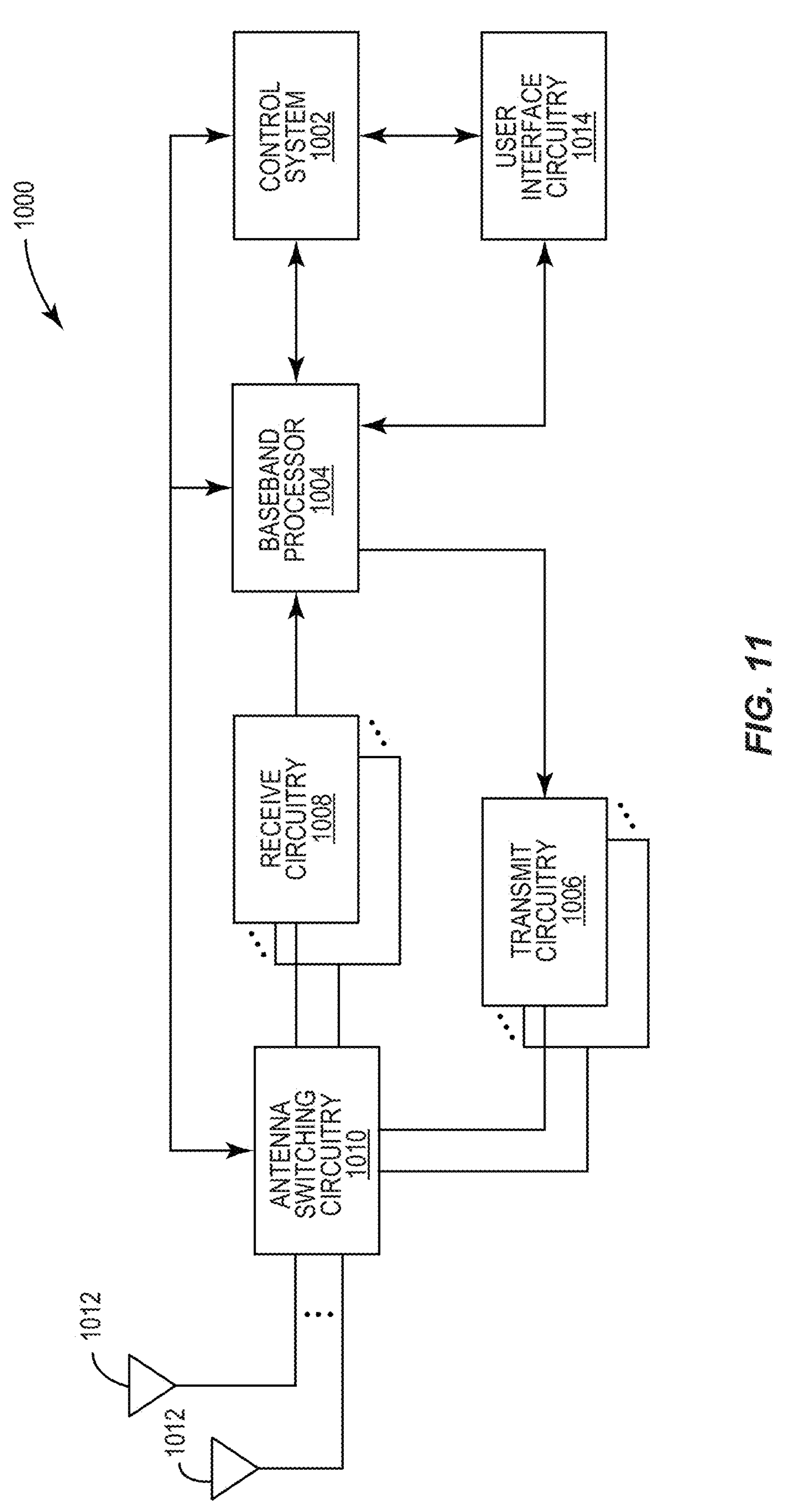
FIG. 11 illustrates a block diagram of a communication device that includes at least one filter architecture.

FIG. 11 illustrates a block diagram of an example communication device 1000 that includes at least one filter architecture using the multiplexing approach described above. The concepts described above may be implemented in various types of the communication device 1000, such as mobile terminals, smart watches, tablets, computers, navigation devices, access points, and like wireless communication devices that support wireless communications, such as cellular, wireless local area network (WLAN), BLUETOOTH, and near field communications. The communication devices 1000 will generally include a control system 1002, a baseband processor 1004, transmit circuitry 1006, receive circuitry 1008, antenna switching circuitry 1010, multiple antennas 1012, and user interface circuitry 1014. In a non-limiting example, the control system 1002 can be a field-programmable gate array (FPGA) or an application-specific integrated circuit (ASIC), as an example. In this regard, the control system 1002 can include at least a microprocessor(s), an embedded memory circuit(s), and a communication bus interface(s). The receive circuitry 1008 receives radio frequency signals via the antennas 1012 and through the antenna switching circuitry 1010 from one or more base stations. A low noise amplifier and a filter of the receive circuitry 1008 cooperate to amplify and remove broadband interference from the received signal for processing. Down conversion and digitization circuitry (not shown) will then down convert the filtered, received signal to an intermediate or baseband frequency signal, which is then digitized into one or more digital streams using an analog-to-digital converter(s) (ADC).

The baseband processor 1004 processes the digitized received signal to extract the information or data bits conveyed in the received signal. This processing typically comprises demodulation, decoding, and error correction operations, as will be discussed in greater detail below. The baseband processor 1004 is generally implemented in one or more digital signal processors (DSPs) and ASICs.

For transmission, the baseband processor 1004 receives digitized data, which may represent voice, data, or control information, from the control system 1002, which it encodes for transmission. The encoded data is output to the transmit circuitry 1006, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the antennas 1012 through the antenna switching circuitry 1010. The multiple antennas 1012 and the replicated transmit and receive circuitries 1006, 1008 may provide spatial diversity. Modulation and processing details will be understood by those skilled in the art. Herein, at least one of the baseband processer 1004, the transmit circuitry 1006, and the receive circuitry 1008 includes one or more filter architectures using the multiplexing approach described above.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A filter architecture comprising:
- a filter bank including a plurality of filters;
- an input switch coupled between a radio frequency (RF) input terminal and an input side of the filter bank; and
- an output switch coupled between an output side of the filter bank and an RF output terminal, wherein:
  - each of the plurality of filters is multiplexed with one or more different filters of the plurality of filters at the input side of the filter bank and the output side of the filter bank;
  - the input switch is controlled to connect a first group of the plurality of filters to the RF input terminal at a given time, and the output switch is controlled to connect a second group of the plurality of filters to the RF output terminal at the given time, wherein the first group of the plurality of filters and the second group of the plurality of filters have one filter in common, such that the input switch and the output switch are configured to select one of the plurality of filters to operate at the given time; and
  - the input switch and the output switch are controlled independently.

2. The filter architecture of claim 1 wherein on either the input side or the output side, two or more filters of the plurality of filters are able to be multiplexed with each other only if the two or more filters of the plurality of filters have no overlap in a frequency domain.

3. The filter architecture of claim 1 wherein each of the plurality of filters is diplexed with a first filter of the plurality of filters at the input side of the filter bank, and is diplexed with a second filter of the plurality of filters at the output side of the filter bank, the first filter being different from the second filter.

4. The filter architecture of claim 1 wherein each of the plurality of filters is triplexed with two filters of the plurality of filters at the input side of the filter bank, and is triplexed with two different filters of the plurality of filters at the output side of the filter bank.

5. The filter architecture of claim 1 wherein each of the plurality of filters is diplexed or triplexed with one or two different filters of the plurality of filters at the input side of the filter bank and the output side of the filter bank.

6. The filter architecture of claim 1 wherein:
- the input switch is a single pole multiple throw (SPnT) switch and includes a plurality of input switch throws; and
- the output switch is an SPnT switch and includes a plurality of output switch throws.

7. The filter architecture of claim 6 wherein when one of the plurality of input switch throws is coupled to a specific group of the plurality of filters, any one of the plurality of output switch throws is coupled to no more than one filter in the specific group of the plurality of filters.

8. The filter architecture of claim 6 wherein:
- a number of the plurality of filters is N, which is an integer number;
- a number of the plurality of input switch throws is smaller than N; and
- a number of the plurality of output switch throws is smaller than N.

9. The filter architecture of claim 8 wherein a number of the plurality of input switch throws is the same as a number of the plurality of output switch throws.

10. The filter architecture of claim 9 wherein:
- the number of the plurality of input switch throws is M, and the number of the plurality of output switch throws is M; and
- M equals $\lceil N/2 \rceil$ or $\lceil N/3 \rceil$.

11. The filter architecture of claim 10 wherein:
- the input switch is controlled by input control bits that determine which one of the plurality of input switch throws is conducted to the RF input terminal;
- the output switch is controlled by output control bits that determine which one of the plurality of output switch throws is conducted to the RF output terminal; and
- the input control bits are independent of the output control bits.

12. The filter architecture of claim 8 wherein a number of the plurality of input switch throws is different from a number of the plurality of output switch throws.

13. The filter architecture of claim 6 wherein:
- throw-to-throw isolation within the input switch is better than a required out of band (OOB) rejection of each of the plurality of filters; and
- throw-to-throw isolation within the output switch is better than a required OOB rejection of each of the plurality of filters.

14. The filter architecture of claim 1 wherein at least one of the plurality of filters is one of a group consisting of bulk acoustic wave (BAW) filters, surface acoustic wave (SAW) filters, and temperature compensated surface acoustic wave (TC-SAW) filters.

15. The filter architecture of claim 1 wherein:
- the filter bank includes eight filters;

the input switch is a single pole four throw (SP4T) switch and includes four input switch throws;

the output switch is an SP4T switch and includes four output switch throws; and each of the eight filters is diplexed with a different filter of the plurality of filters at the input side of the filter bank and the output side of the filter bank.

16. The filter architecture of claim 1 wherein:

the filter bank includes eight filters;

the input switch is a single pole three throw (SP3T) switch and includes three input switch throws;

the output switch is an SP3T switch and includes three output switch throws; and each of the eight filters is diplexed or triplexed with one or more different filters of the plurality of filters at the input side of the filter bank and the output side of the filter bank.

17. The filter architecture of claim 1 wherein:

the filter bank includes twenty-four filters;

the input switch is a single pole eight throw (SP8T) switch and includes eight input switch throws;

the output switch is an SP8T switch and includes eight output switch throws; and each of the eight filters is triplexed with two different filters of the plurality of filters at the input side of the filter bank and the output side of the filter bank.

18. A combo filter architecture comprising:

a combo input switch coupled to a radio frequency (RF) input terminal;

a combo output switch coupled to an RF output terminal; and a plurality of filter architectures parallel to each other and coupled between the combo input switch and the combo output switch, wherein:

the combo input switch and the combo output switch are configured to select one of the plurality of filter architectures to operate at a given time; and each of the plurality of filter architectures comprises a filter bank with a plurality of filters, an input switch coupled between the combo input switch and an input side of the filter bank, and an output switch coupled between an output side of the filter bank and the combo output switch, wherein:

each of the plurality of filters is multiplexed with one or more different filters of the plurality of filters at the input side of the filter bank and the output side of the filter bank;

the input switch is controlled to connect a first group of the plurality of filters to the combo input switch at a given time, and the output switch is controlled to connect a second group of the plurality of filters to the combo output switch at the given time, wherein the first group of the plurality of filters and the second group of the plurality of filters have one filter in common, such that the input switch and the output switch are configured to select one of the plurality of filters to connect to both the combo input switch and the combo output switch at the given time; and the input switch and the output switch are controlled independently.

19. The combo filter architecture of claim 18 wherein the combo input switch and the combo output switch are controlled by common control bits.

20. The combo filter architecture of claim 18 wherein each of the plurality of filters is diplexed or triplexed with one or two different filters of the plurality of filters at the input side of the filter bank and the output side of the filter bank.

21. The combo filter architecture of claim 18 wherein on either the input side or the output side, two or more filters of the plurality of filters are able to be multiplexed with each other only if the two or more filters of the plurality of filters have no overlap in a frequency domain.

22. A method of designing a filter architecture comprising:

determining a number of filters of a filter bank in the filter architecture;

determining which multiplexing approach to be applied to the filters of the filter bank;

determining a number of switch throws of an input switch and an output switch;

routing each filter of the filter bank to both the input switch and the output switch using the determined multiplexing approach, wherein each filter of the filter bank is multiplexed with one or more different filters of the filter bank at an input side of the filter bank and at an output side of the filter bank; and programming an allocation of the switch throws of the input switch and the output switch, such that only one specific filter of the filter bank is operating at a given time.

23. A communication device comprising:

a baseband processor;

receive circuitry; and transmit circuitry, wherein:

at least one of the baseband processer, the transmit circuitry, and the receive circuitry includes a filter architecture; and the filter architecture includes a filter bank with a plurality of filters, an input switch coupled between a radio frequency (RF) input terminal and an input side of the filter bank, and an output switch coupled between an output side of the filter bank and a RF output terminal, wherein:

each of the plurality of filters is multiplexed with one or more different filters of the plurality of filters at the input side of the filter bank and the output side of the filter bank;

the input switch is controlled to connect a first group of the plurality of filters to the RF input terminal at a given time, and the output switch is controlled to connect a second group of the plurality of filters to the RF output terminal at the given time, wherein the first group of the plurality of filters and the second group of the plurality of filters have one filter in common, such that the input switch and the output switch are configured to select one of the plurality of filters to operate at the given time; and the input switch and the output switch are controlled independently.

* * * * *